United States Patent
Lee et al.

(10) Patent No.: US 10,553,668 B2
(45) Date of Patent: Feb. 4, 2020

(54) DISPLAY DEVICE

(71) Applicant: Samsung Display Co., Ltd., Yongin-Si, Gyeonggi-Do (KR)

(72) Inventors: Wonse Lee, Seoul (KR); Hyunwoong Kim, Gwangmyeong-si (KR); Joong-Soo Moon, Hwaseong-si (KR); Ae Shin, Seoul (KR); Ji-eun Lee, Seoul (KR); Kwangmin Kim, Seoul (KR); Seungkyu Lee, Asan-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 16/387,968

(22) Filed: Apr. 18, 2019

(65) Prior Publication Data
US 2019/0245028 A1    Aug. 8, 2019

Related U.S. Application Data

(63) Continuation of application No. 15/923,507, filed on Mar. 16, 2018, now Pat. No. 10,304,921.

(30) Foreign Application Priority Data

Jun. 19, 2017  (KR) .................. 10-2017-0077562

(51) Int. Cl.
*H01L 27/32* (2006.01)
*H01L 51/00* (2006.01)
(Continued)

(52) U.S. Cl.
CPC ...... *H01L 27/3276* (2013.01); *H01L 27/3262* (2013.01); *H01L 51/0031* (2013.01);
(Continued)

(58) Field of Classification Search
None
See application file for complete search history.

(56) References Cited

U.S. PATENT DOCUMENTS 7,227,312 B2    6/2007  Kwak et al.
8,076,845 B2 *  12/2011  Maru .................. H01L 27/3276
                                                        313/506
(Continued)

FOREIGN PATENT DOCUMENTS

KR      10-0579195 B1       5/2006
KR      10-1300914 B1       8/2013
KR    10-2017-0006321 A     1/2017

OTHER PUBLICATIONS

Extended European Search Report, Application No. 18178205.3, dated Oct. 12, 2018, 9 pages.

*Primary Examiner* — Raj R Gupta
(74) *Attorney, Agent, or Firm* — Innovation Counsel LLP

(57) ABSTRACT

A display panel may include a detection line overlapped with a non-display region, detection pads connected to the detection line, and an input line connecting an input pad of the detection pads to the detection line. The detection line may include a first portion, which is provided at a level different from a level of the input line and includes an end connected to the input line through a first contact hole in a first contact region, and a second portion, which is provided at a level different from the level of the first portion and is connected to the first portion through a second contact hole in a second contact region. A distance between the first and second portions in a non-contact region may be less than a distance between the first contact hole and the second portion.

15 Claims, 18 Drawing Sheets

(51) Int. Cl.
*G09G 3/3225* (2016.01)
*G09G 3/3266* (2016.01)
(52) U.S. Cl.
CPC ......... *G09G 3/3225* (2013.01); *G09G 3/3266* (2013.01); *G09G 2330/12* (2013.01)

(56) References Cited

U.S. PATENT DOCUMENTS

| | | |
|---|---|---|
| 8,704,762 B2 | 4/2014 | Anno et al. |
| 2005/0098785 A1 | 5/2005 | You |
| 2014/0240521 A1 | 8/2014 | Kwak |
| 2016/0140896 A1* | 5/2016 | Kwon .................. G09G 3/3225 345/76 |
| 2016/0322451 A1 | 11/2016 | Park |
| 2017/0062408 A1 | 3/2017 | Chung |
| 2018/0158741 A1* | 6/2018 | Kim ........................ H01L 22/12 |

\* cited by examiner

DISPLAY DEVICE

CROSS-REFERENCE TO RELATED APPLICATIONS

This application is a continuation application of U.S. patent application Ser. No. 15/923,507 filed on Mar. 16, 2018, which claims priority under 35 USC § 119 to Korean Patent Application No. 10-2017-0077562, filed on Jun. 19, 2017, in the Korean Intellectual Property Office, the entire contents of which are hereby incorporated by reference.

BACKGROUND

The present disclosure relates to a display device, and in particular, to a display device with improved durability.

Recently, various display devices, such as a liquid crystal display device, an organic electric field light-emitting display device, an electrowetting display device, a plasma display device, and an electrophoresis display device are being developed.

During a process of fabricating a display device, various problems, such as disconnection or short circuit of a display signal line or pixel defect, may occur in the display device. An inspection or test process is performed to filter such problems in advance.

By measuring properties of test interconnection lines that are formed on a specific region or an additional blank region of the display device, it is possible to examine electric characteristics of the display device and thereby to prevent or filter damage of an interconnection structure or electronic devices of the display device.

SUMMARY

Some embodiments of the inventive concept provide a display device with improved durability.

According to some embodiments of the inventive concept, a display device may include a display panel including a display region and a non-display region enclosing the display region, when viewed in a plan view. The display panel may include an organic light emitting device provided in the display region, circuit devices configured to drive the organic light emitting device, a detection line overlapped with the non-display region, detection pads connected to the detection line, and an input line connecting an input pad of the detection pads to the detection line. The detection line may include a first line portion provided at a level different from a level of the input line, the first line portion including an end portion, which is connected to the input line through a first interconnection contact hole in a first contact region, and a second line portion provided at a level from the level of the first line portion and connected to the first line portion through a second interconnection contact hole in a second contact region. When viewed in the plan view, the first line portion may be provided closer to the display region than the second line portion, and a distance between the first line portion and the second line portion in a non-contact region may be less than a distance between the first interconnection contact hole and the second line portion.

In some embodiments, the distance between the first line portion and the second line portion in the non-contact region may be less than a distance between the second interconnection contact hole and the second line portion.

In some embodiments, the display panel may further include an output line connecting an output pad of the detection pads to the detection line, and the second line portion may include an end portion, which is connected to the first line portion, and an opposite end portion, which is connected to the output line.

In some embodiments, the second line portion and the output line may be provided in the form of a single body.

In some embodiments, when viewed in a plan view, at least a portion of the detection line may have a bent shape a plurality of times in the form of a branch.

In some embodiments, the input line and the output line may be provided at a same level as the level of the second line portion.

In some embodiments, the display device may further include a third line portion connecting the output line and the second line portion to each other. An end of the third line portion may be connected to an opposite end of the second line portion through a third interconnection contact hole, and an opposite end of the third line portion may be connected to the output line through a fourth interconnection contact hole.

In some embodiments, the first line portion may be provided at a same level as a level of the third line portion.

In some embodiments, when viewed in a plan view, the third line portion may be provided closer to the display region than the second line portion.

In some embodiments, at least one of the first and second interconnection contact holes may be provided in plural.

In some embodiments, the first interconnection contact hole may include a plurality of first interconnection contact holes, some of which have different sizes from each other.

In some embodiments, the second interconnection contact hole may include a plurality of second interconnection contact holes, some of which have different sizes from each other.

In some embodiments, the non-display region may include a first non-display region enclosing the display region, the detection line being provided in the first non-display region, and a second non-display region connected to the first non-display region, the second non-display region including a pad region, on which the detection pads may be provided, and a signal line region, on which the input line and output line may be provided.

In some embodiments, the detection line may be provided in the first non-display region and the signal line region of the second non-display region, and the input line and the output line may be connected to the detection line, in the signal line region.

In some embodiments, the non-display region may include a bending region, and the display panel may be bent about a bending axis in the bending region.

In some embodiments, each of the detection line, the input line, and the output line may be provided in plural. Each of the detection lines may include a first detection line provided adjacent to a side region of the display region, and a second detection line provided adjacent to an opposite side region of the display region. The first and second detection lines may be connected to corresponding ones of the input and output lines.

In some embodiments, the circuit devices may include a first transistor including a first input electrode, a first output electrode, a first control electrode, and a first semiconductor pattern, and a second transistor including a second input electrode, a second output electrode, a second control electrode, and a second semiconductor pattern. The first and second control electrodes may be electrically disconnected from the first and second semiconductor patterns by at least one insulating layer. The first control electrode may overlap with the first semiconductor pattern, when viewed in a plan view, and the second control electrode may overlap with the second semiconductor pattern, when viewed in a plan view.

In some embodiments, the first line portion may be provided at a same level as a level of the first input electrode and the first output electrode.

In some embodiments, the second line portion, the first control electrode, and the second control electrode may be provided at a same level.

In some embodiments, the second control electrode may be provided on the second semiconductor pattern.

In some embodiments, the first control electrode may be provided below the first semiconductor pattern.

In some embodiments, the circuit devices may further include an upper electrode, which is provided on, and electrically disconnected from, the second control electrode, when viewed in a plan view. The upper electrode may be provided to overlap with the second control electrode to define a capacitor.

In some embodiments, the second line portion may be provided at a same level as a level of the second control electrode, and the input line and the output line may be provided at a same level as a level of the first control electrode and the upper electrode.

In some embodiments, the distance between the first interconnection contact hole and the second line portion and a distance between the second interconnection contact hole and the second line portion may be larger than or equal to 50 μm.

According to some embodiments of the inventive concept, a display device may include a display panel including a display region and a non-display region enclosing the display region, when viewed in a plan view. The display panel may include a detection line, which is provided on the non-display region to enclose the display region, and in which a plurality of contact regions and a non-contact region adjacent to the contact regions are defined, detection pads connected to the detection line, and an input line and an output line connected to the detection pads. The detection line may include a first line portion provided at a level different from a level of the input line, the first line portion including an end portion, which is connected to the input line through an interconnection contact hole formed in a first contact region of the contact regions, and a second line portion provided at a level different from the level of the first line portion, the second line portion including an end portion, which is connected to the first line portion through an interconnection contact hole formed in a second contact region of the contact regions, and an opposite end portion, which is connected to the output line. A distance between the first line portion at the contact regions and the second line portion may be larger than a distance between the first line portion at the non-contact region and the second line portion.

In some embodiments, a plurality of interconnection contact holes may be provided in each of the contact regions.

In some embodiments, some of the plurality of interconnection contact holes may have different sizes from each other.

According to some embodiments of the inventive concept, a display device may include a display panel including a display region and a non-display region enclosing the display region, when viewed in a plan view. The display panel may include an organic light emitting device provided in the display region, circuit devices configured to drive the organic light emitting device, a detection line provided in the non-display region, an input pad and an output pad connected to the detection line, and an input line connecting the input pad to the detection line. The detection line may include a first line portion provided at a level different from a level of the input line, the first line portion including an end portion connected to the input line through a first interconnection contact hole in a first contact region, and a second line portion provided at a level different from the level of the first line portion, the second line portion including an end portion, which is connected to the first line portion through a second interconnection contact hole in a second contact region, and an opposite end portion, which is connected to the output pad. When viewed in the plan view, the first line portion may be provided closer to the display region than the second line portion, and a distance between the first line portion and the second line portion in a non-contact region may be less than a distance between the first interconnection contact hole and the second line portion.

In some embodiments, the distance between the first line portion and the second line portion may be less than that between the second interconnection contact hole and the second line portion.

According to some embodiments of the inventive concept, a display device may include a display panel including a display region and a non-display region enclosing the display region, when viewed in a plan view. The display panel may include an organic light emitting device provided in the display region, circuit devices configured to drive the organic light emitting device, a detection line provided in the non-display region, detection pads connected to the detection line, and an input line and an output line connecting the detection pads to the detection line. The detection line may include a first line portion provided at a level different from a level of the input line, the first line portion including an end portion connected to the input line through a first interconnection contact hole in a first contact region, a second line portion provided at a level different from the level of the first line portion, the second line portion including an end portion connected to an opposite end portion of the first line portion through a second interconnection contact hole in a second contact region, and a third line portion provided at a level different from the level of the first line portion, the third line portion including an end portion, which is connected to an opposite end portion of the second line portion through a third interconnection contact hole, and an opposite end portion, which is connected to the output line through a fourth interconnection contact hole. A distance between the first line portion and the second line portion in a non-contact region may be less than a distance between one of the first to fourth interconnection contact holes and the second line portion.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
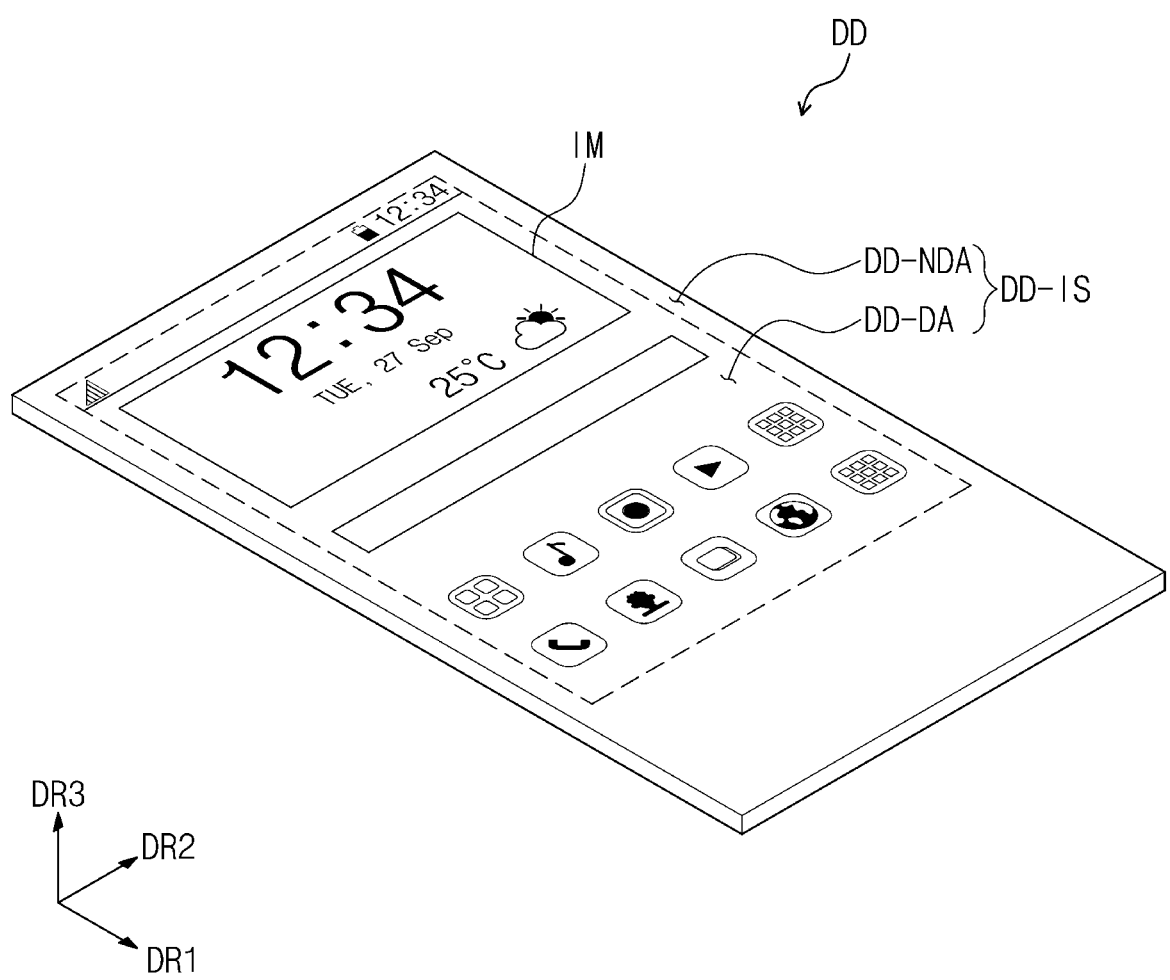
FIG. 1 is a perspective view of a display device according to some embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a perspective view of a display device DD according to some embodiments of the inventive concept.

Referring to FIG. 1, the display device DD may include a display surface DD-IS, which is used to display an image IM. The display surface DD-IS may be parallel to both of two different directions (e.g., a first direction DR1 and a second direction DR2). A normal direction of the display surface DD-IS (i.e., a thickness direction of the display device DD) will be referred to as a third direction DR3.

Hereinafter, the third direction DR3 may be used to differentiate a front or top surface of each element from a back or bottom surface. However, directions indicated by the first to third directions DR1, DR2, and DR3 may be relative concepts and may not be limited to the above example, and, for example, in certain embodiments, they may be changed to indicate other directions.

As shown in FIG. 1, the display surface DD-IS may include a display region DD-DA, which is used to display the image IM, and a non-display region DD-NDA, which is placed adjacent to the display region DD-DA. The non-display region DDA-NDA may be configured not to display the image IM. In the display surface DD-IS, the non-display region DD-NDA may be defined to surround the display region DD-DA. As an example of the image IM, icon images are shown in FIG. 1.

Figure 2:
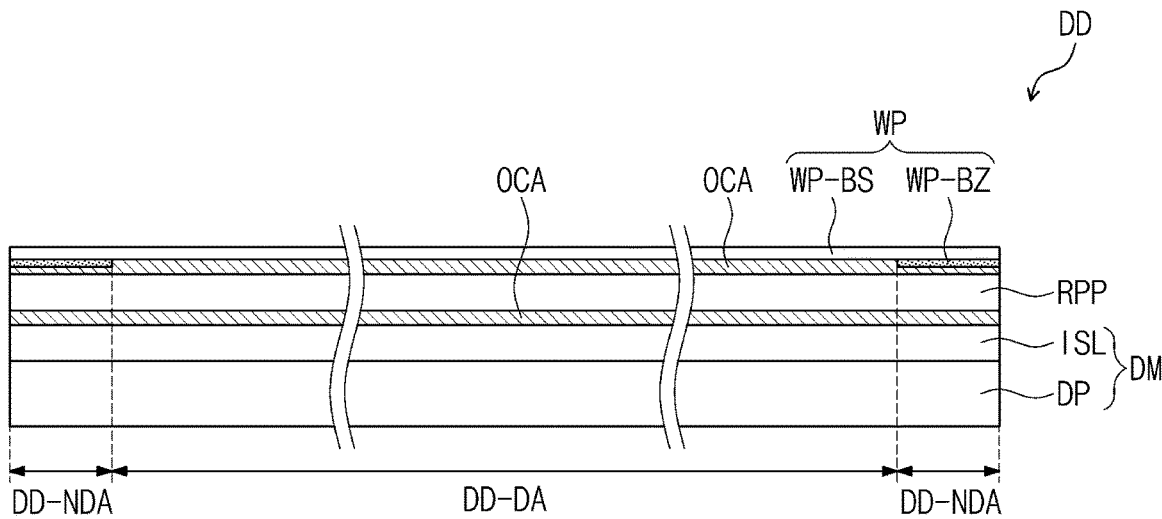
FIG. 2 is a sectional view of the display device shown in FIG. 1.
Figure 2:
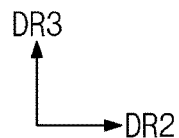

FIG. 2 is a sectional view of the display device shown in FIG. 1.

FIG. 2 illustrates a vertical section defined by the second and third directions DR2 and DR3. In order to describe a stacking structure of a functional panel and/or functional units constituting the display device DD, FIG. 2 is illustrated in a simplified manner.

Referring to FIG. 2, the display device DD may include a display panel DP, an input sensing layer ISL, an anti-reflection panel RPP, and a window panel WP. The input sensing layer ISL may be provided on the display panel DP. The input sensing layer ISL and the display panel DP may be provided in an integrated or single-body structure, thereby constituting a display module DM. The display module DM, the anti-reflection panel RPP, and the window panel WP may be coupled to each other by an optically-transparent adhesive layer OCA.

The display panel DP may be configured to generate an image to be displayed to the outside, and the input sensing layer ISL may be configured to obtain coordinate information regarding an external input (e.g., touch event). Although not shown in the drawings, in certain embodiments, the display device DD may further include a protection structure placed on a bottom surface of the display panel DP. The protection structure and the display panel DP may be coupled to each other by an adhesive layer.

According to some embodiments of the inventive concept, the display panel DP may be a light-emitting type display panel, but the inventive concept is not limited to a specific type of the display panel DP. For example, the display panel DP may be an organic light emitting display panel or a quantum dot light-emitting display panel. A light emitting layer of the organic light emitting display panel may include an organic light emitting material. A light emitting layer of the quantum dot light-emitting display panel may include quantum dots and/or quantum rods. For the sake of simplicity, the description that follows will refer to an example in which the display panel DP is the organic light emitting display panel.

The anti-reflection panel RPP may be configured to reduce reflectance of an external light that is incident from an outer space to the window panel WP. Although not shown, in certain embodiments, the anti-reflection panel RPP may include a phase retarder and a polarizer. The phase retarder may be of a film type or a liquid crystal coating type and may include a λ/2 and/or λ/4 phase retarder. The polarizer may also be of a film type or a liquid crystal coating type. The polarizer of the film type may include an elongated synthetic resin film, whereas the polarizer of the liquid crystal coating type may include liquid crystals arranged with a specific orientation. The anti-reflection panel RPP may further include a protection film, in addition to the phase retarder and the polarizer.

Although not shown, in certain embodiments, the anti-reflection panel RPP may further include color filters and a black matrix, which is provided adjacent to the color filters.

The window panel WP may include a base film WP-BS and a light-blocking pattern WP-BZ. The base film WP-BS may include a glass substrate and/or a synthetic resin film. The base film WP-BS may not be limited to a single-layered structure. For example, in certain embodiments, the base film WP-BS may include two or more films that are bonded to each other by an adhesive film.

The light-blocking pattern WP-BZ may be a colored organic layer. The light-blocking pattern WP-BZ may be formed by, for example, a coating method. Although not shown in the drawings, the window panel WP may further include a functional coating layer provided on the base film WP-BS. The functional coating layer may include an anti-fingerprint layer, an anti-reflection layer, a hard coating layer, and so forth.

Figure 3:
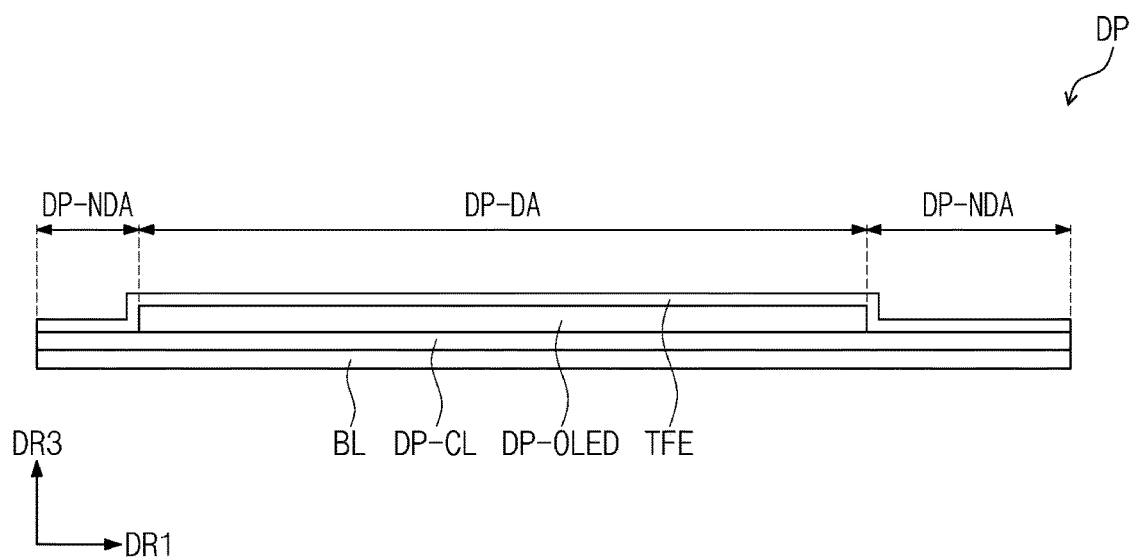
FIG. 3 is a sectional view of the display panel shown in FIG. 2.

FIG. 3 is a sectional view of the display panel DP shown in FIG. 2.

Referring to FIG. 3, the display panel DP may include a base layer BL, a circuit device layer DP-CL provided on the base layer BL, a display device layer DP-OLED, and a thin-film encapsulation layer TFE. Although not shown in the drawings, the display panel DP may further include functional layers, such as an anti-reflection layer and a refractive index controlling layer.

The base layer BL may be formed of or include a synthetic resin film. For example, the base layer BL may include at least one of polyimide resins. However, the inventive concept is not limited to a specific material for the base layer BL. For example, the base layer BL may be formed of or include a glass substrate, a metal substrate, or an organic/inorganic composite substrate.

The circuit device layer DP-CL may include at least one insulating layer and at least one circuit device. Hereinafter, an insulating layer in the circuit device layer DP-CL will be referred to as an intermediate insulating layer. The intermediate insulating layer may include at least one intermediate inorganic layer and/or at least one intermediate organic layer. The circuit device may include signal lines, pixel driving circuits, and so forth. The formation of the circuit device layer DP-CL may include forming an insulating layer, a semiconductor layer, and a conductive layer using a coating or deposition process and patterning the insulating layer, the semiconductor layer, and the conductive layer using a photolithography and etching process.

The display device layer DP-OLED may be provided in a display region DP-DA. The display region DP-DA of the display panel DP may correspond to the display region DD-DA of the display device DD. The display device layer DP-OLED may include a plurality of light-emitting devices. The display device layer DP-OLED may include a plurality of organic light emitting diodes. The display device layer DP-OLED may further include an organic layer, such as a pixel definition layer.

A thin-film encapsulation layer TFE may be provided to hermetically seal the display device layer DP-OLED. The thin-film encapsulation layer TFE may include at least one insulating layer. In some embodiments, the thin-film encapsulation layer TFE may include at least one inorganic layer (hereinafter, an inorganic encapsulation layer). The inorganic encapsulation layer may be used to protect the display device layer DP-OLED from moisture or oxygen. The inorganic encapsulation layer may include at least one of a silicon nitride layer, a silicon oxynitride layer, a silicon oxide layer, a titanium oxide layer, or an aluminum oxide layer, but the inventive concept is not limited thereto.

However, the inventive concept is not limited to the example. For example, in certain embodiments, the thin-film encapsulation layer TFE may include at least one organic layer (hereinafter, an organic encapsulation layer). The organic encapsulation layer may be used to protect the display device layer DP-OLED from a contamination material such as dust particles. The organic encapsulation layer may include an acrylic organic layer, but the inventive concept is not limited thereto.

Figure 4:
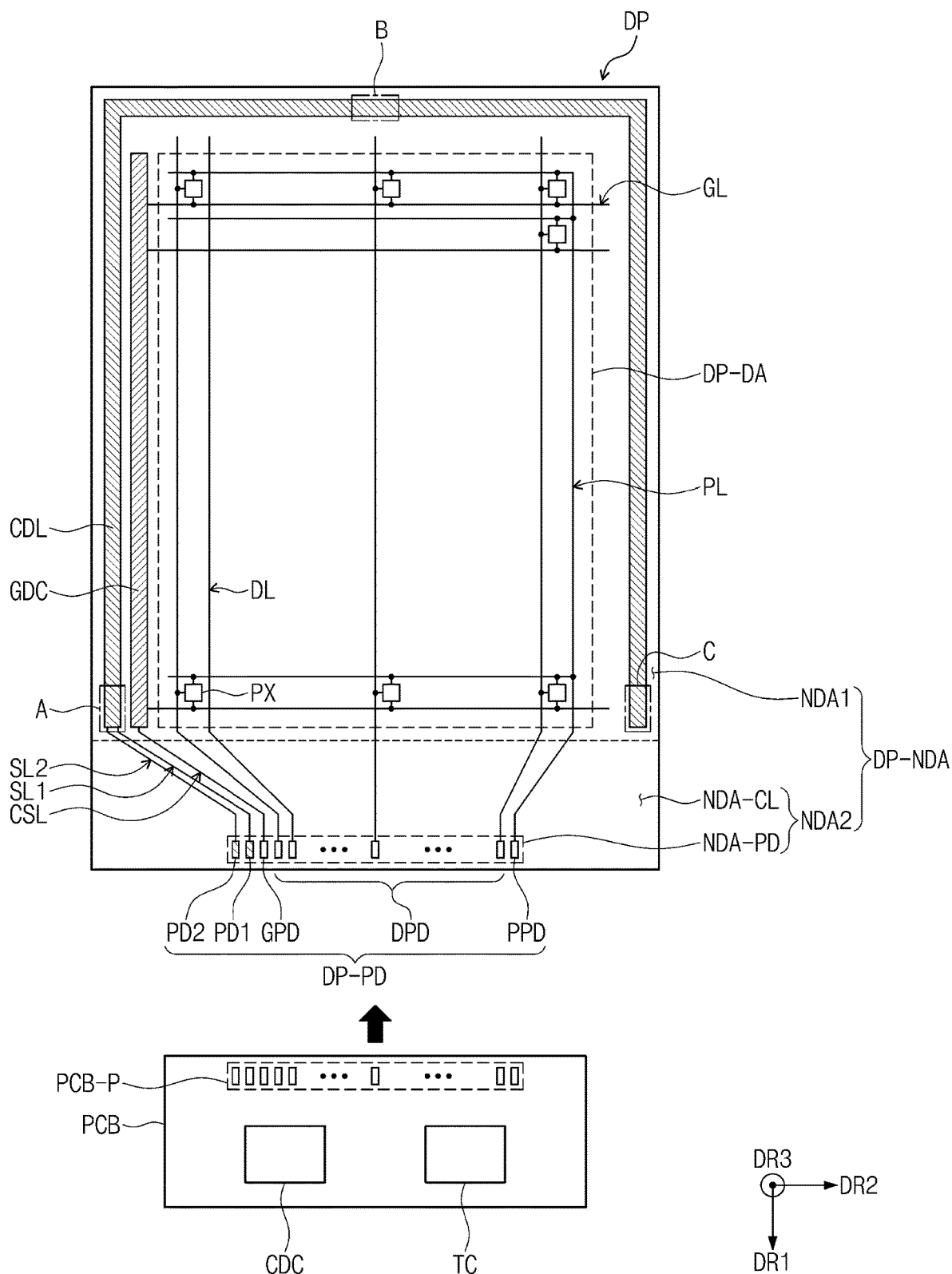
FIG. 4 is a plan view of the display panel shown in FIG. 3.

FIG. 4 is a plan view of the display panel shown in FIG. 3.

Referring to FIG. 4, the display panel DP may include the display region DP-DA and a non-display region DP-NDA, when viewed in a plan view. As described above, the display region DP-DA of the display panel DP may correspond to the display region DD-DA of the display device DD. The non-display region DP-NDA of the display panel DP may correspond to the non-display region DD-NDA of the display device DD.

In the present embodiments, the non-display region DP-NDA may be defined along an edge of the display region DP-DA to surround the display region DP-DA.

For example, the non-display region DP-NDA may include a first non-display region NDA1 and a second non-display region NDA2. The first non-display region NDA1 may be provided to surround the display region DP-DA. A detection line CDL to be described below may be provided in the first non-display region NDA1.

The second non-display region NDA2 may be located at a side of the first non-display region NDA1 in the first direction DR1 and may be connected to the first non-display region NDA1. The second non-display region NDA2 may include a signal line region NDA-CL and a pad region NDA-PD. The pad region NDA-PD may be placed at an end region of the second non-display region NDA2 in the first direction DR1. However, the inventive concept is not limited to a specific position of the pad region NDA-PD.

The display panel DP may include a driving circuit GDC, a plurality of signal lines DL, GL, PL, CSL, SL1, and SL2, a detection line CDL, a plurality of signal pads DP-PD, and a plurality of pixels PX.

The pixels PX may be placed in the display region DP-DA. Each of the pixels PX may include an organic light emitting diode and a pixel driving circuit connected thereto. The driving circuit GDC, the signal lines DL, GL, PL, CSL, SL1, and SL2, the signal pads DP-PD, and the pixel driving circuit may be included in the circuit device layer DP-CL shown in FIG. 3.

The driving circuit GDC may be placed in the first non-display region NDAL The driving circuit GDC may include a scan driving circuit. The scan driving circuit may be configured to generate a plurality of scan signals and sequentially output the scan signals to a plurality of scan lines GL to be described below. In addition, the scan driving circuit may be configured to output other control signals to a driving circuit of the pixel PX.

The scan driving circuit may include a plurality of thin-film transistors that are formed by the same process as that for the driving circuit of the pixel PX (e.g., by a low temperature polycrystalline silicon (LTPS) process or a low temperature polycrystalline oxide (LTPO) process).

The detection line CDL may be placed outside the driving circuit GDC. For example, the detection line CDL may be placed at an outermost region of the first non-display region NDA1. The detection line CDL will be described in more detail with reference to FIGS. 6 to 9.

The signal lines DL, GL, PL, CSL, SL1, and SL2 may include scan lines GL, data lines DL, a power line PL, a control signal line CSL, an input line SL1, and an output line SL2.

Each of the scan lines GL may be connected to corresponding ones of the pixels PX, and each of the data lines DL may be connected to corresponding ones of the pixels PX. The power line PL may be connected to the pixels PX.

The control signal line CSL may be used to provide control signals to the scan driving circuit. The signal pads DP-PD may be connected to end portions of the signal lines DL, GL, PL, CSL, SL1, and SL2. The signal pads DP-PD may include a scan signal pad GPD, a power pad PPD, display signal pads DPD, and detection pads PD1 and PD2.

The scan signal pad GPD may be connected to the control signal line CSL. The power pad PPD may be connected to the power line PL. The display signal pads DPD may be connected to corresponding ones of the data lines DL. The detection pads PD1 and PD2 may be connected to the detection line CDL.

Substantially, most of the signal lines DL, GL, PL, CSL, SL1, and SL2 may be the signal lines DL, GL, and PL connected to the pixels PX. The signal lines DL, GL, and PL connected to each pixel PX may be connected to transistors T1 and T2 (e.g., see FIGS. 5 and 6) of the pixel PX. Each of the signal lines DL, GL, and PL connected to the pixel PX may be provided to have a single- or multi-layered structure, may be provided in the form of a single body, or may include two or more portions. In the case of the two or more portions, they may be provided to form two or more different layers and may be connected to each other through a contact hole, which is formed to penetrate an insulating layer therebetween.

As shown in FIG. 4, a circuit board PCB electrically connected to the display panel DP may be provided. The circuit board PCB may be a rigid or flexible circuit board. The circuit board PCB may be directly coupled to the display panel DP or may be connected to the display panel DP through an additional circuit board.

A timing control circuit TC and a detection circuit CDC may be provided on the circuit board PCB. The timing control circuit TC may be configured to control an operation of the display panel DP, and the detection circuit CDC may be configured to measure electrical resistance of the detection line CDL and then to examine whether there is a crack, based on the measurement result. Each of the timing control circuit TC and the detection circuit CDC may be provided in the form of an integrated circuit chip and may be mounted on the circuit board PCB. Although not shown, an input sensing circuit (not shown) for controlling the input sensing layer ISL may be further provided in the circuit board PCB.

The circuit board PCB may include circuit board pads PCB-P electrically connected to the display panel DP. Although not shown, the circuit board PCB may further include signal lines, which are provided to connect the circuit board pads PCB-P to the timing control circuit TC and/or the detection circuit CDC.

However, the inventive concept is not limited to specific positions of the timing control circuit TC and the detection circuit CDC. For example, although not shown in the drawings, in certain embodiments, the timing control circuit TC and the detection circuit CDC may be mounted on the non-display region DP-NDA of the display panel DP.

Figure 5:
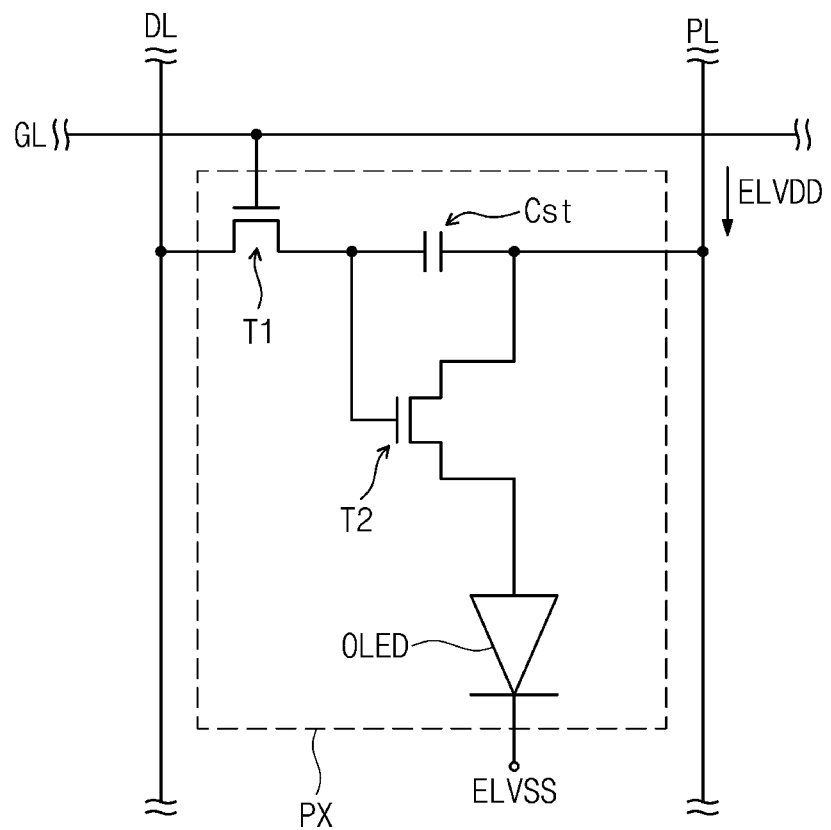
FIG. 5 is an equivalent circuit diagram of a pixel according to some embodiments of the inventive concept.

FIG. 5 is an equivalent circuit diagram of a pixel according to some embodiments of the inventive concept.

FIG. 5 illustrates an example, in which one scan line GL, one data line DL, one power line PL, and one pixel PX connected thereto are provided. However, the structure of the pixel PX is not limited to that shown in FIG. 5, and in certain embodiments, it may be variously changed.

An organic light emitting diode OLED may be a top-emission type diode or a bottom-emission type diode. The pixel PX may include a first or switching transistor T1, a second or driving transistor T2, and a capacitor Cst, which are used as a pixel driving circuit for driving the organic light emitting diode OLED. A first power voltage ELVDD may be provided to the second transistor T2, and a second power voltage ELVSS may be provided to the organic light emitting diode OLED. The second power voltage ELVSS may be lower than the first power voltage ELVDD.

If a scan signal is applied to the scan line GL, the first transistor T1 may output a data signal applied to the data line DL in response to the scan signal. The capacitor Cst may be charged to have a voltage corresponding to the data signal, which is transmitted from the first transistor T1. The second transistor T2 may be connected to the organic light emitting diode OLED. The second transistor T2 may control a driving current flowing through the organic light emitting diode OLED, based on an amount of charge stored in the capacitor Cst.

The equivalent circuit of FIG. 5 is just one of possible equivalent circuits of the pixel, but the inventive concept is not limited thereto. The pixel PX may be configured to further include at least one transistor or at least one capacitor. In certain embodiments, the organic light emitting diode OLED may be coupled to the power line PL and the second transistor T2.

Figure 6:
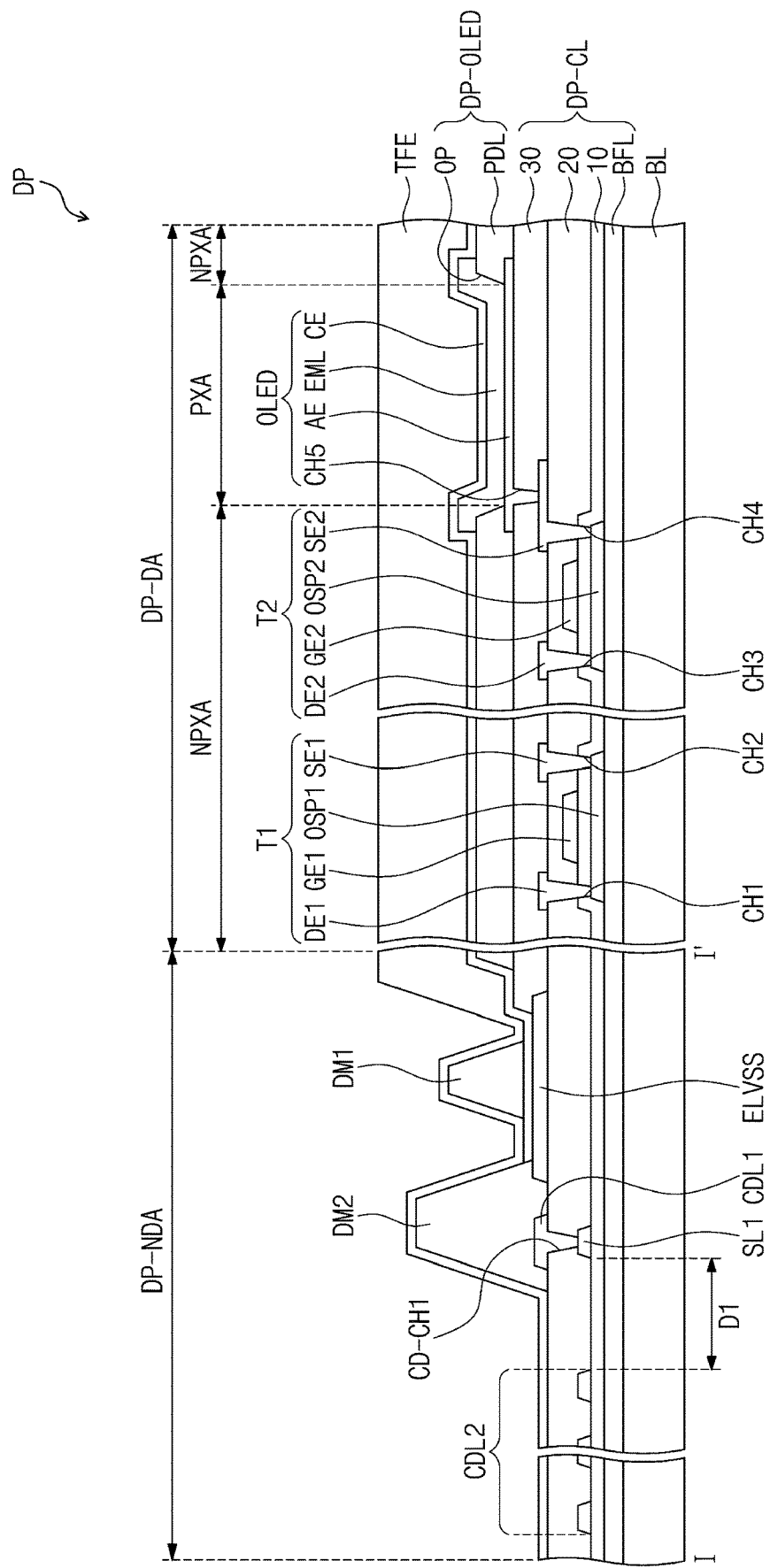
FIG. 6 is an enlarged sectional view of a display panel according to some embodiments of the inventive concept.

FIG. 6 is an enlarged sectional view of a display panel according to some embodiments of the inventive concept.

Referring to FIG. 6, the circuit device layer DP-CL, the display device layer DP-OLED, and the thin-film encapsulation layer TFE may be sequentially placed on the base layer BL. In the present embodiments, the circuit device layer DP-CL may include a buffer layer BFL made of an inorganic layer, a first intermediate inorganic layer 10, a second intermediate inorganic layer 20, and an intermediate organic layer 30 made of an organic layer. The inorganic and organic layers may not be limited to specific materials, and in certain embodiments, the buffer layer BFL may be optionally provided or omitted.

The first transistor T1 and the second transistor T2 may include a semiconductor pattern OSP1 (hereinafter, a first semiconductor pattern) and a semiconductor pattern OSP2 (hereinafter, a second semiconductor pattern), respectively, which are provided on the buffer layer BFL. The first semiconductor pattern OSP1 and the second semiconductor pattern OSP2 may be formed of or include at least one of amorphous silicon, poly silicon, or metal oxide semiconductor materials.

The first intermediate inorganic layer 10 may be provided on the first semiconductor pattern OSP1 and the second semiconductor pattern OSP2. The first transistor T1 and the second transistor T2 may include a control electrode GE1 (hereinafter, a first control electrode) and a control electrode GE2 (hereinafter, a second control electrode), respectively, which are provided on the first intermediate inorganic layer 10. The first control electrode GE1 and the second control electrode GE2 may be formed using the photolithography process as that for forming the scan lines GL of FIG. 5.

The second intermediate inorganic layer 20 may be provided on the first intermediate inorganic layer 10 to cover the first control electrode GE1 and the second control electrode GE2. The first transistor T1 may include an input electrode DE1 (hereinafter, a first input electrode) and an output electrode SE1 (hereinafter, a first output electrode) provided on the second intermediate inorganic layer 20, and the second transistor T2 may include an input electrode DE2 (hereinafter, a second input electrode) and an output electrode SE2 (hereinafter, a second output electrode) provided on the second intermediate inorganic layer 20.

A first contact hole CH1 and a second contact hole CH2 may be formed to penetrate both of the first and second intermediate inorganic layers 10 and 20, and the first input electrode DE1 and the first output electrode SE1 may be connected to two different portions of the first semiconductor pattern OSP1 through the first and second contact holes CH1 and CH2, respectively. A third contact hole CH3 and a fourth contact hole CH may be formed to penetrate both of the first and second intermediate inorganic layers 10 and 20, and the second input electrode DE2 and the second output electrode SE2 may be connected to two different portions of the second semiconductor pattern OSP2 through the third and fourth contact holes CH3 and CH4, respectively.

In FIG. 6, the first transistor T1 and the second transistor T2 are illustrated to have a top gate structure, in which the first and second control electrodes GE1 and GE2 are provided on the first and second semiconductor patterns OSP1 and OSP2, respectively, but the inventive concept is not limited thereto. For example, in certain embodiments, at least one of the first transistor T1 and the second transistor T2 may be modified to have a bottom gate structure. This will be described in more detail with reference to FIG. 19.

The intermediate organic layer 30 may be provided on the second intermediate inorganic layer 20 to cover the first input electrode DE1, the second input electrode DE2, the first output electrode SE1, and the second output electrode SE2. The intermediate organic layer 30 may be provided to have a flat surface.

The display device layer DP-OLED may be provided on the intermediate organic layer 30. The display device layer DP-OLED may include a pixel definition layer PDL and the organic light emitting diode OLED. The pixel definition layer PDL may be formed of or include an organic material. A first electrode AE may be provided on the intermediate organic layer 30. The first electrode AE may be connected to the second output electrode SE2 through a fifth contact hole CH5 penetrating the intermediate organic layer 30. An opening OP may be defined in the pixel definition layer PDL. The opening OP of the pixel definition layer PDL may be provided to expose at least a portion of the first electrode AE. In certain embodiments, the pixel definition layer PDL may be omitted.

The pixel PX may be placed in the display region DP-DA. The display region DP-DA may include a light-emitting region PXA and a non-light-emitting region NPXA adjacent to the light-emitting region PXA. The non-light-emitting region NPXA may be provided to surround the light-emitting region PXA. In the present embodiments, the light-emitting region PXA may be defined to correspond to a region of the first electrode AE exposed by the opening OP.

In certain embodiments, the light-emitting region PXA may be overlapped with at least one of the first and second transistors T1 and T2. For example, the opening OP may be enlarged, and not only the first electrode AE but also a light emitting layer EML to be described below may also be enlarged.

The light emitting layer EML may be provided on a region corresponding to the opening OP. In other words, the light emitting layer EML may have an isolated structure that is provided for each of the pixels PX. The light emitting layer EML may include an organic material and/or an inorganic material. The light emitting layer EML may be configured to generate a specific color light.

In the present embodiments, the light emitting layer EML is illustrated to have a patterned structure, but the light emitting layer EML may be provided in common on a plurality of the pixels PX. Here, the light emitting layer EML may be configured to generate a white-color light. Also, the light emitting layer EML may have a multi-layered structure called 'tandem'.

A second electrode CE may be provided on the light emitting layer EML. The second electrode CE may be provided in common on a plurality of the pixels PX.

The thin-film encapsulation layer TFE may be provided on the second electrode CE. The thin-film encapsulation layer TFE may be provided in common on a plurality of the pixels PX. In the present embodiments, the thin-film encapsulation layer TFE may be provided to directly cover the second electrode CE. In some embodiments, a capping layer may be provided between the thin-film encapsulation layer TFE and the second electrode CE, thereby covering the second electrode CE. Here, the thin-film encapsulation layer TFE may be provided to directly cover the capping layer.

According to some embodiments of the inventive concept, although not shown in the drawings, the display device layer DP-OLED may further include a hole control layer (not shown) and an electron control layer (not shown), which are provided on and below the light emitting layer EML.

Figure 7:
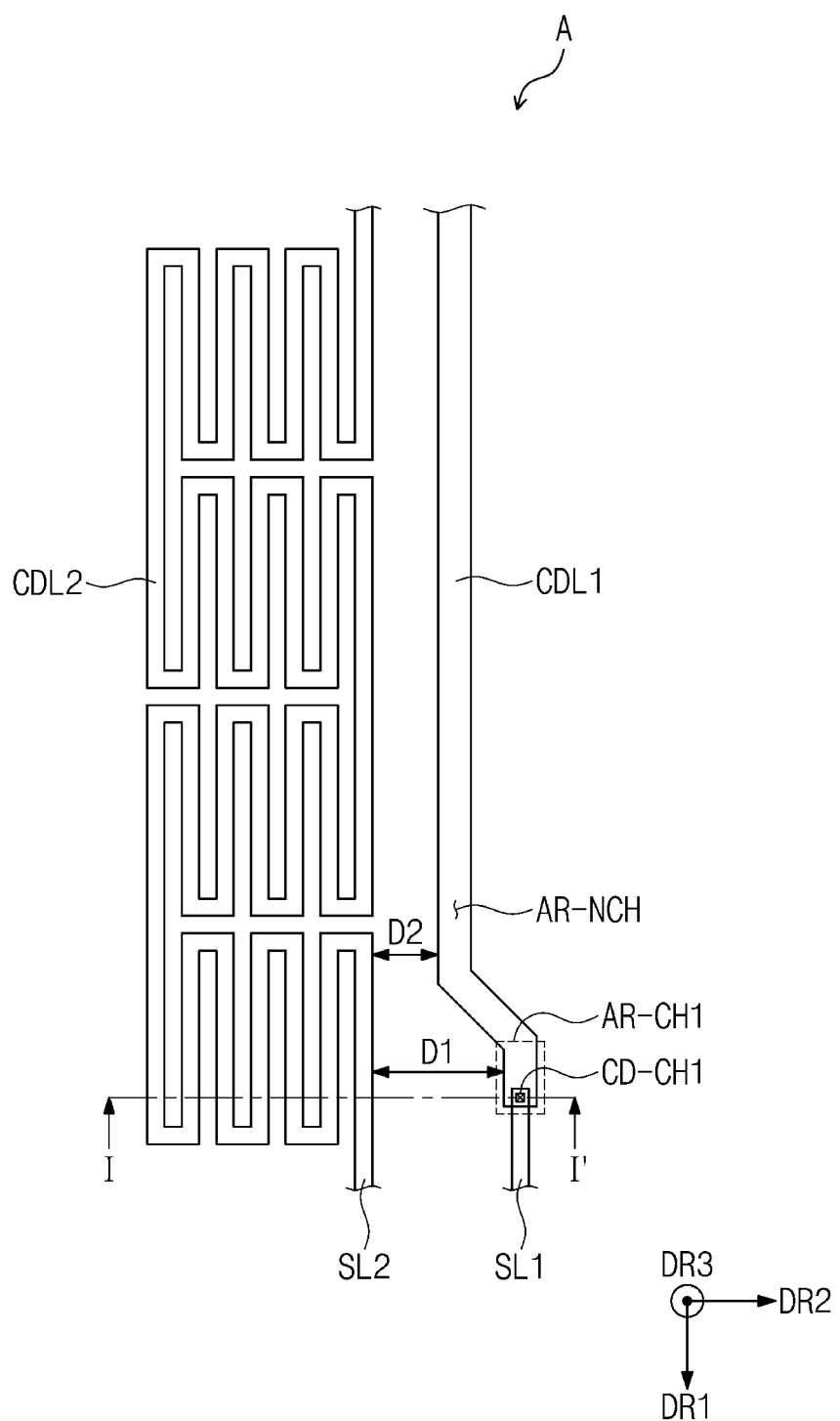
FIG. 7 is an enlarged view of a region 'A' of FIG. 4.
Figure 8:
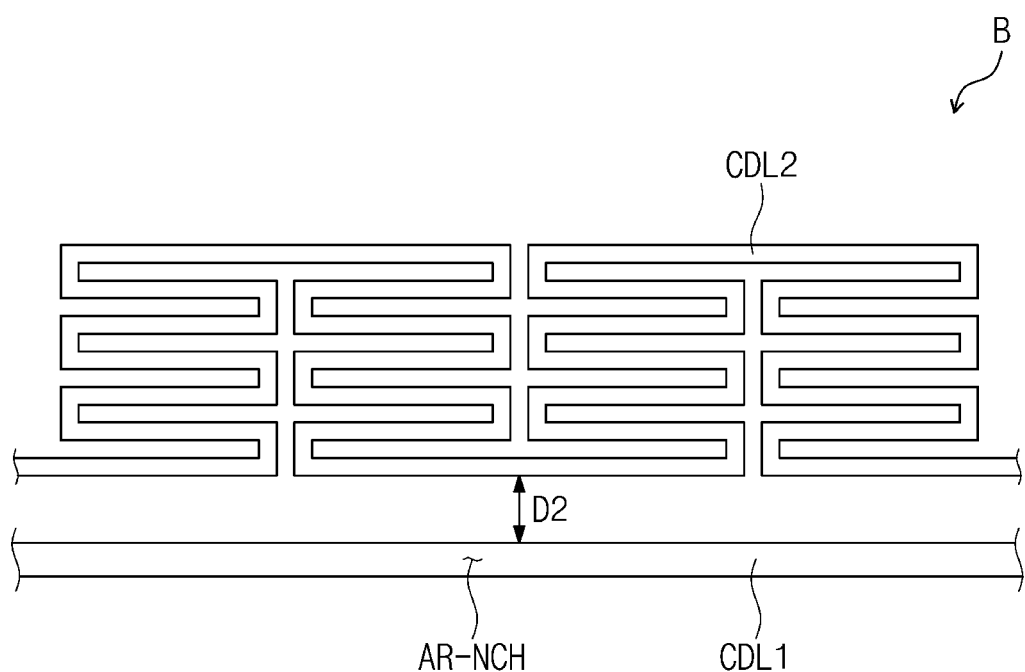
FIG. 8 is an enlarged view of a region 'B' of FIG. 4.
Figure 9:
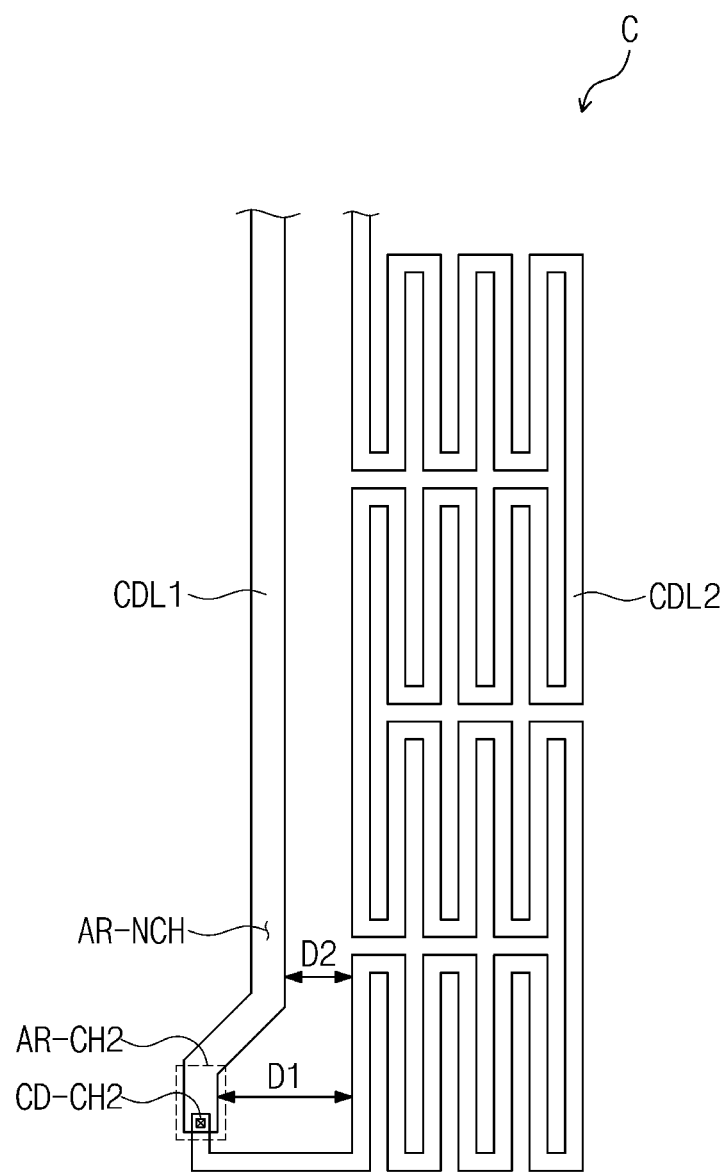
FIG. 9 is an enlarged view of a region 'C' of FIG. 4.
Figure 9:
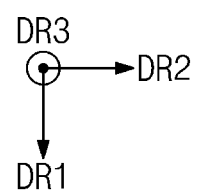

FIG. 7 is an enlarged view of a region 'A' of FIG. 4, and FIG. 8 is an enlarged view of a region 'B' of FIG. 4. FIG. 9 is an enlarged view of a region 'C' of FIG. 4.

For convenience in illustration, some regions of the detection line CDL, which are respectively indicated by the reference numbers 'A', 'B', and 'C' of FIG. 4, are enlargedly illustrated in FIGS. 7 to 9.

In FIG. 6, a sectional view taken along line I-I' of FIG. 7 is illustrated.

Referring to FIGS. 4 and 6 to 9, the detection line CDL may be provided on the first non-display region NDA1 to enclose the display region DP-DA. For example, in the present embodiments, the detection line CDL may be provided on regions of the first non-display region NDA1, except for a region adjacent to the second non-display region NDA2.

The detection line CDL may be connected to the input line SL1 and the output line SL2. The input line SL1 and the output line SL2 may be connected to the detection pads PD1 and PD2. In detail, the input line SL1 may be connected to an input pad PD1, and the output line SL2 may be connected to an output pad PD2. The input pad PD1 and the output pad PD2 may be connected to the detection circuit CDC.

In some embodiments, the detection circuit CDC may be connected to at least one of the display signal pads DPD. The detection circuit CDC may be configured to compare data, which are obtained by measuring electrical resistance of the detection line CDL, and to provide a signal to one of the display signal pads DPD when a crack occurs. The signal may be used to drive the pixels PX connected to the display signal pad DPD. In other words, a signal alerting occurrence of a crack may be displayed on the display region DP-DA.

In the present embodiments, the input pad PD1 and the output pad PD2 may be arranged in the second direction DR2, at a side region of the pad region NDA-PD. Furthermore, the input line SL1 and the output line SL2, which are connected to the input pad PD1 and the output pad PD2, respectively, may be extended to be inclined toward a side region of the display panel DP in the second direction DR2 and may be connected to the detection line CDL provided in the first non-display region NDA1. The inventive concept is not limited to the specific positions of the input pad PD1 and the output pad PD2.

In the present embodiments, the detection line CDL may include a first line portion CDL1 and a second line portion CDL2. The first line portion CDL1 and the second line portion CDL2 may extend along the edge region of the display region DP-DA. The first line portion CDL1 may be positioned closer to the display region DP-DA than the second line portion CDL2.

The first line portion CDL1 may be connected to the input line SL1. For example, an end of the first line portion CDL1 may be connected to the input line SL1, at a side region of the first non-display region NDA1 in the second direction DR2.

The first line portion CDL1 and the input line SL1 may be provided at different levels. The first line portion CDL1 may be connected to the input line SL1 through a first interconnection contact hole CD-CH1.

For example, the first line portion CDL1 may be provided at the same level as that of the input electrodes DE1 and DE2 and the output electrodes SE1 and SE2 of the first and second transistors T1 and T2. The input line SL1 and the output line SL2 may be provided at the same level as that of the control electrodes GE1 and GE2 of the first and second transistors T1 and T2.

In some embodiments, the display panel DP may further include at least one dam portion (e.g., see DM1 and DM2 of FIG. 6) provided on the non-display region DP-NDA. The dam portions DM1 and DM2 may be provided closer to the display region DP-DA than the detection line CDL. Although not shown in FIG. 4, the dam portions DM1 and DM2 may extend along the edge region of the display region DP-DA. The dam portions DM1 and DM2 may prevent the thin-film encapsulation layer TFE from overflowing to the out side of the dam portions DM1, DM2.

As shown in FIG. 7, when viewed in a plan view, a region, in which the first interconnection contact hole CD-CH1 is formed, will be referred to as a first contact region AR-CH1. In the present embodiments, the first interconnection contact hole CD-CH1 may be formed by an etching process using plasma.

As shown in FIG. 9, the first line portion CDL1 may be connected to the second line portion CDL2. For example, an opposite end of the first line portion CDL1 may be connected to an end of the second line portion CDL2, at an opposite side region of the first non-display region NDA1 in the second direction DR2.

The first line portion CDL1 and the second line portion CDL2 may be provided at different levels. The first line portion CDL1 may be connected to the second line portion CDL2 through a second interconnection contact hole CD-CH2. The second line portion CDL2 may be provided at the same level as that of the input line SL1 and the output line SL2.

When viewed in a plan view, a region, in which the second interconnection contact hole CD-CH2 is formed, will be referred to as a second contact region AR-CH2. The remaining regions on the detection line CDL, except for the first and second contact regions AR-CH1 and AR-CH2, will be referred to as a non-contact region AR-NCH. In the present embodiments, the second interconnection contact hole CD-CH2 may be formed by an etching process using plasma.

In the present embodiments, the first line portion CDL1 and the second line portion CDL2 may be provided at different levels. For example, the first line portion CDL1 and the second line portion CDL2 may be formed of or include different materials. Accordingly, it may be possible to suppress or prevent the first and second line portions CDL1 and CDL2 from being capacitively coupled to each other.

The second line portion CDL2 may be provided in the form of a densely-packed infill pattern including a plurality of linear segments, each of which is extended from another (e.g., at right angle). In other words, the second line portion CDL2 has a bent shape a plurality of times in the form of a branch. Due to the bending structure formed by the linear segments of the second line portion CDL2, the second line portion CDL2 may have a large occupation area on the first non-display region NDA1, even when it does not have a large thickness. This make it possible to more precisely detect a crack over an outer region of the display panel DP.

In the present embodiments, the bended portions of the second line portion CDL2 may be arranged in an extension direction of the first line portion CDL1 or along an outer edge of the display region DP-DA, but the inventive concept is not limited thereto. For example, shapes, extension and bending directions, and the bending number of the bended portions of the second line portion CDL2 may be variously changed.

The second line portion CDL2 may be connected to the output line SL2. For example, an opposite end of the second line portion CDL2 may be connected to the output line SL2, at a side region of the first non-display region NDA1 in the second direction DR2.

The second line portion CDL2 may be provided at the same level as that of the output line SL2. Furthermore, the second line portion CDL2 and the output line SL2 may be provided to form a single body at the same level.

In the present embodiments, a distance between a first line portion CDL1 and a second line portion CDL2 may be changed depending on whether there are the contact regions AR-CH1 and AR-CH2.

In detail, a distance between the first line portion CDL1 positioned in the first or second contact region AR-CH1 or AR-CH2 and the second line portion CDL2 positioned in the non-contact region AR-NCH will be referred to as a first distance D1. Also, a distance between the first and second line portions CDL1 and CDL2 positioned in the non-contact region AR-NCH will be referred to as a second distance D2. In the present embodiments, the first distance D1 may be larger than the second distance D2.

In other words, a distance D1 between the first interconnection contact hole CD-CH1 in the first contact region AR-CH1 and the second line portion CDL2 in the non-contact region (not shown) may be larger than a distance D2 between the first line portion CDL1 and the second line portion CDL2 in the non-contact region AR-NCH. A distance D1 between the second interconnection contact hole CD-CH2 in the second contact region AR-CH2 and the second line portion CDL2 in the non-contact region (not shown) may be larger than a distance D2 between the first and second line portions CDL1 and CDL2 in the non-contact region (not shown).

In the present embodiments, the larger the first distance D1, the better. If the first distance D1 is increased, it may be possible to reduce a frequency of static electricity charging (ESD) occurring in the detection line CDL. In some embodiments, the first distance D1 may be set to the largest distance by which the first line portion CDL1 and the second line portion CDL2 can be spaced apart from each other on the first non-display region NDA1.

In some embodiments, the first distance D1 may be larger than or equal to about 50 µm, and the second distance D2 may be less than or equal to about 10 µm.

Although not shown, in certain embodiments, additional lines may be further provided between the first line portion CDL1 and the display region DP-DA. In this case, a third distance, which is defined as a distance between the first line portion CDL1 in the contact regions AR-CH1 and AR-CH2 and the additional lines, may be larger than a fourth distance, which is defined as a distance between the first line portion CDL1 in the non-contact region AR-NCH and the additional lines. For example, the third distance may be larger than or equal to about 50 µm, and the fourth distance may be less than or equal to about 10 µm.

In general, the static electricity discharging (ESD) may occur frequently in the contact regions AR-CH1 and AR-CH2. In detail, electric charges may be accumulated in an end of each of the first line portion CDL1, the second line portion CDL2 and the input lines SL1 provided in the contact regions AR-CH1 and AR-CH2. In such a case, if a plasma etching process is performed to form the first and second interconnection contact holes CD-CH1 and CD-CH2, reactive materials in plasma may be charged by the electric charges accumulated in the end of each of the first line portion CDL1, the second line portion CDL2 and the input lines SL1.

In the case where, unlike the previously described embodiments of the inventive concept, the distance between the first line portion CDL1 and the second line portion CDL2 is uniform, due to the static electricity discharging (ESD), which may occur in the contact regions AR-CH1 and AR-CH2, a crack may be formed in the second line portion CDL2 provided in the non-contact region AR-NCH. By contrast, according to some embodiments of the inventive concept, the distance D1 between the first interconnection contact hole CD-CH1 in the first contact region AR-CH1 and the second line portion CDL2 in the non-contact region AR-NCH may be larger than the distance D2 between the first and second line portions CDL1 and CDL2 in the non-contact region AR-NCH. In this case, it may be possible to suppress or prevent a crack from occurring in the second line portion CDL2. In other words, it may be possible to improve durability or reliability of the display device.

Figure 10:
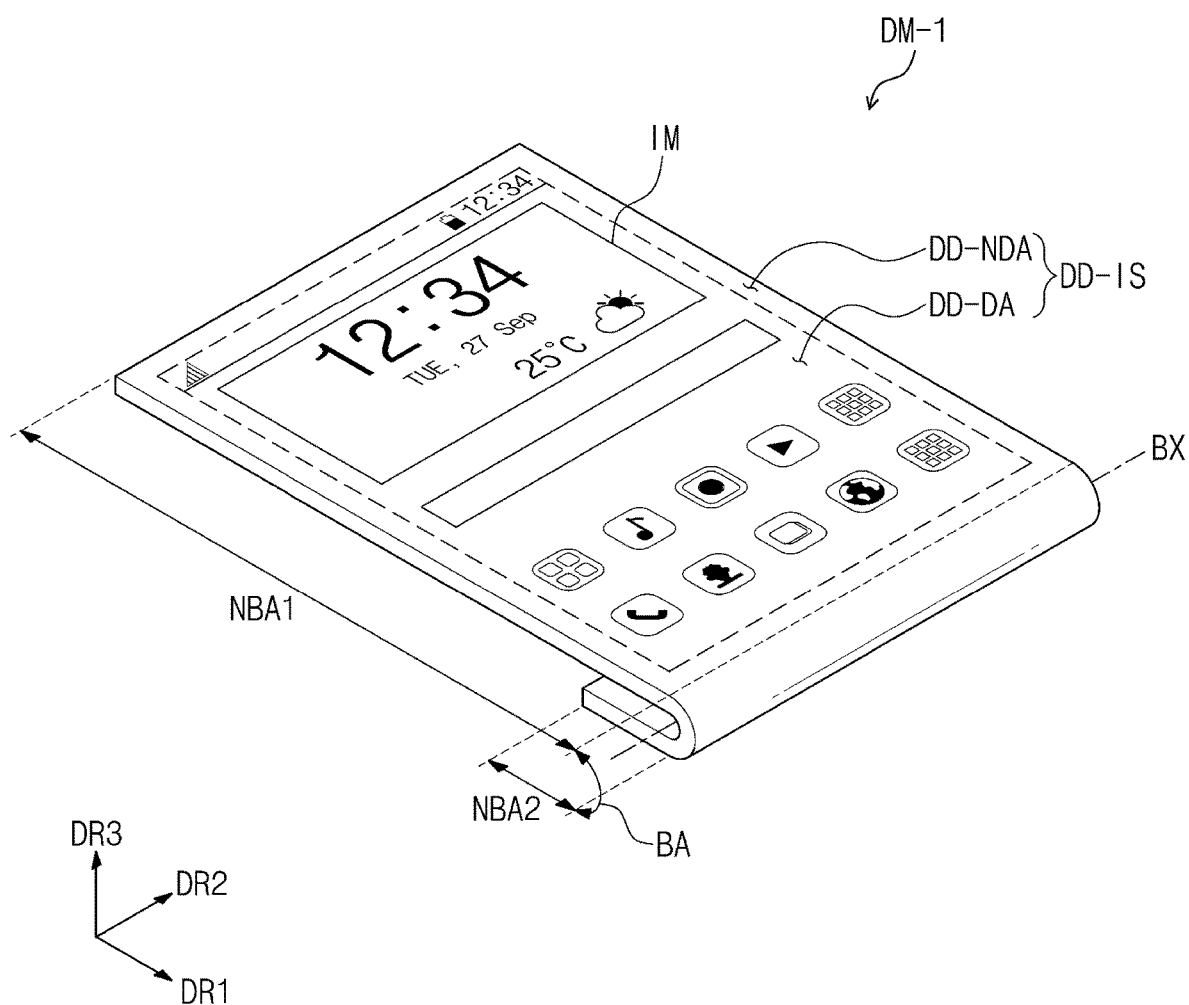
FIG. 10 is a perspective view of a display device according to other embodiments of the inventive concept.
Figure 11:
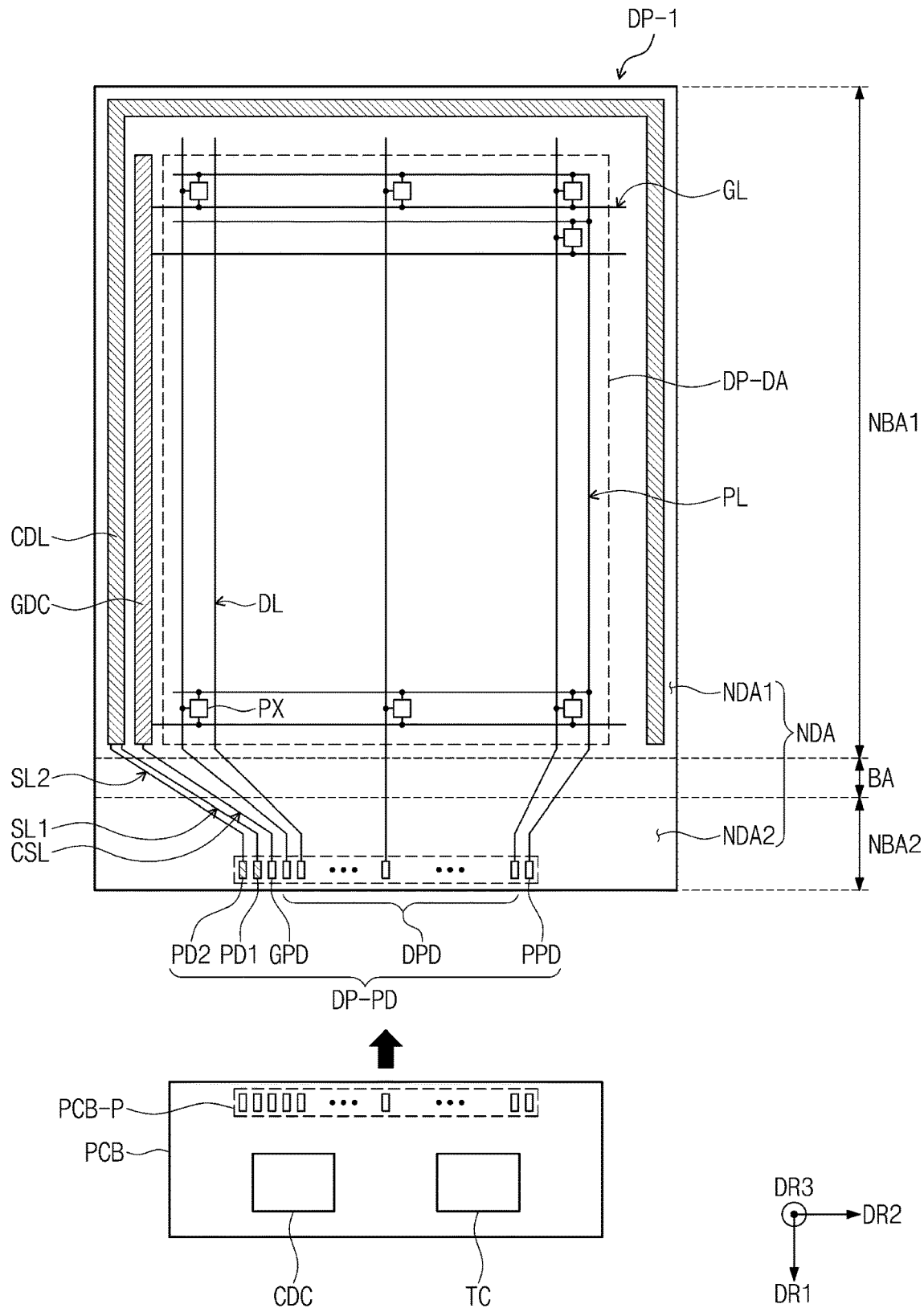
FIG. 11 is a plan view of a display panel according to other embodiments of the inventive concept.

FIG. 10 is a perspective view of a display module DM-1 according to other embodiments of the inventive concept, and FIG. 11 is a plan view of a display panel DP-1 according to other embodiments of the inventive concept.

For concise description, a previously described element may be identified by a similar or identical reference number without repeating an overlapping description thereof. Other elements that are not separately described may be configured to have substantially the same technical features as those in the previously described embodiments.

Referring to FIGS. 10 and 11, the display module DM-1 may include a plurality of regions which are defined depending on its operation mode. For example, the display module DM-1 may include a first region NBA1, a second region NBA2, and a third region BA between the first and second regions NBA1 and NBA2. The third region BA may be configured to be bent about a bending axis BX and may be a region that is configured to have a variable curvature. The first region NBA1, the second region NBA2, and the third region BA may be referred to as a first non-bending region NBA1, a second non-bending region NBA2, and a bending region BA, respectively. In the present embodiments, the first non-bending region NBA1 may be overlapped with the first non-display region NDA1 and the display region DP-DA, and the bending region BA and the second non-bending region NBA2 may be overlapped with the second non-display region NDA2.

The display module DM-1 may be configured to be bent in an outer-bending manner, allowing the display surface DD-IS to be exposed to the outside. In the present embodiments, it may be possible to reduce an area of a bezel of the display device.

Figure 12:
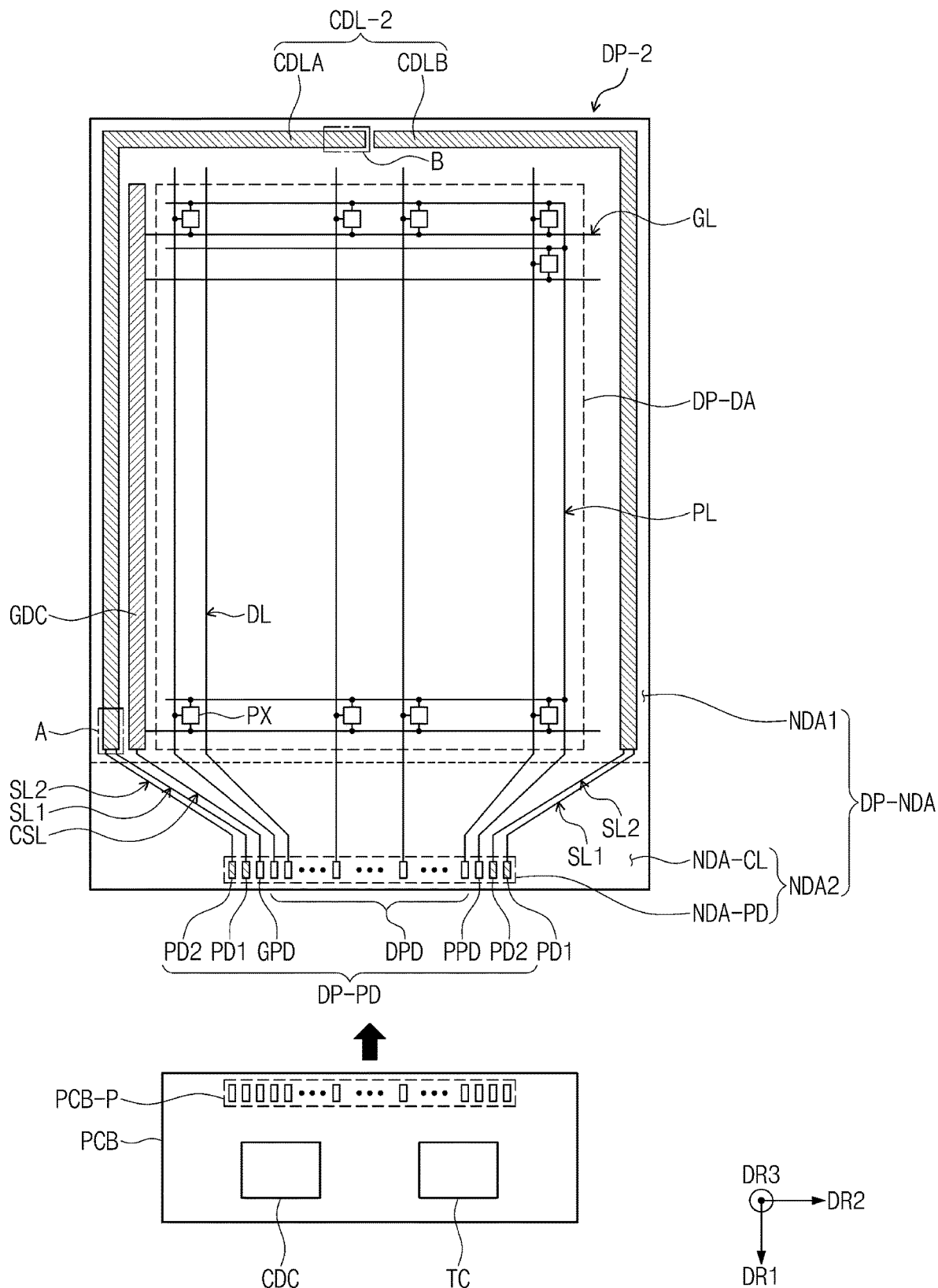
FIG. 12 is a plan view of a display panel according to other embodiments of the inventive concept.
Figure 13:
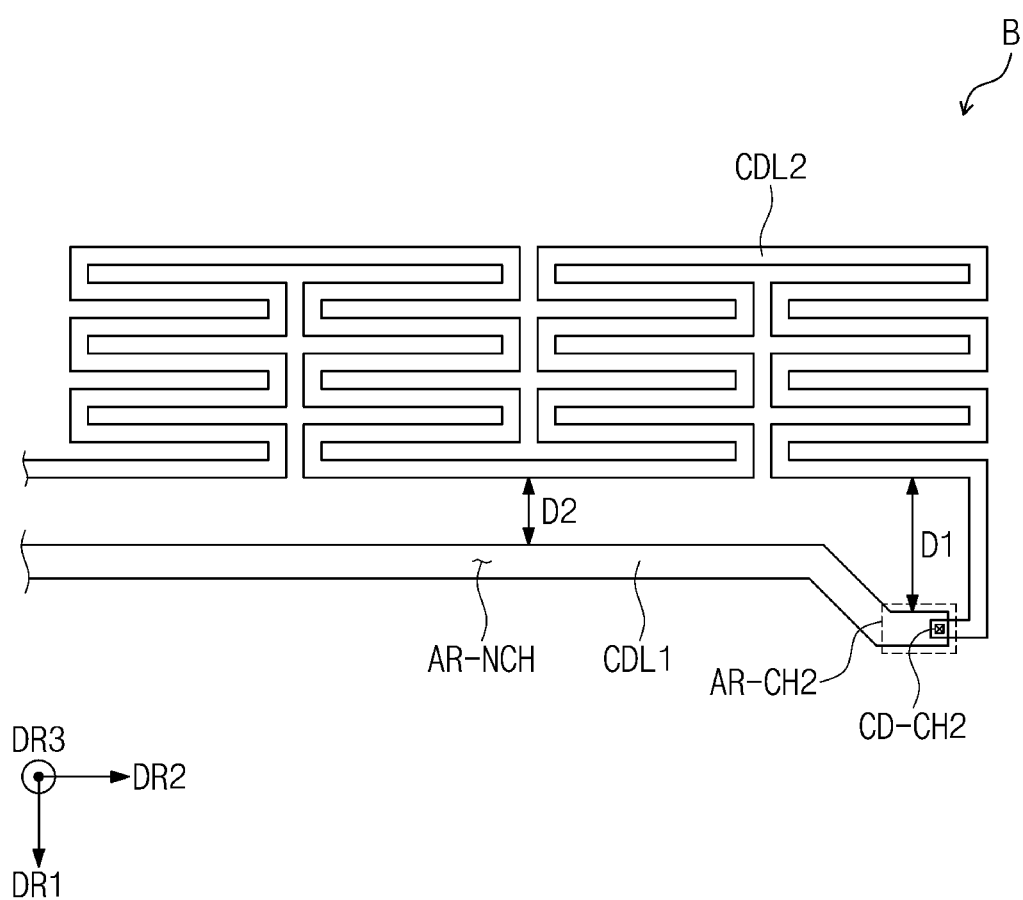
FIG. 13 is an enlarged view of a region 'B' of FIG. 12.

FIG. 12 is a plan view of a display panel DP-2 according to other embodiments of the inventive concept, and FIG. 13 is an enlarged view of a region 'B' of FIG. 12.

For concise description, a previously described element may be identified by a similar or identical reference number without repeating an overlapping description thereof. Other elements that are not separately described may be configured to have substantially the same technical features as those in the previously described embodiments.

Referring to FIGS. 12 and 13, according to other embodiments of the inventive concept, a plurality of detection lines CDL-2 may be provided.

For example, the detection lines CDL-2 may include a first detection line CDLA and a second detection line CDLB. The first detection line CDLA may be provided at a side region of the first non-display region NDA1 in the second direction DR2 to enclose a side region of the display region DP-DA in the second direction DR2.

The second detection line CDLB may be provided at an opposite side region of the first non-display region NDA1 in the second direction DR2 to enclose an opposite side region of the display region DP-DA in the second direction DR2.

In the present embodiments, the input and output lines SL1 and SL2 of the first detection line CDLA may be provided at a side region of the signal line region NDA-CL in the second direction DR2, and the input and output lines SL1 and SL2 of the second detection line CDLB may be provided at an opposite side region of the signal line region NDA-CL in the second direction DR2.

Also, in the present embodiments, the detection pads PD1 and PD2 connected to the first detection line CDLA may be provided at a side region of the pad region NDA-PD in the second direction DR2, and the detection pads PD1 and PD2 connected to the second detection line CDLB may be provided at an opposite side region of the pad region NDA-PD in the second direction DR2.

The line portions CDL1 and CDL2 of the first detection line CDLA may have substantially the same structure as those of the second detection line CDLB. Thus, for concise description, only the region 'B' of the first detection line CDLA is illustrated in FIG. 13.

In the present embodiments, an example, in which a pair of the detection lines CDLA and CDLB are provided, have been described, but the inventive concept is not limited thereto. In certain embodiments, three or more detection lines may be provided in the non-display region DP-NDA.

Figure 14:
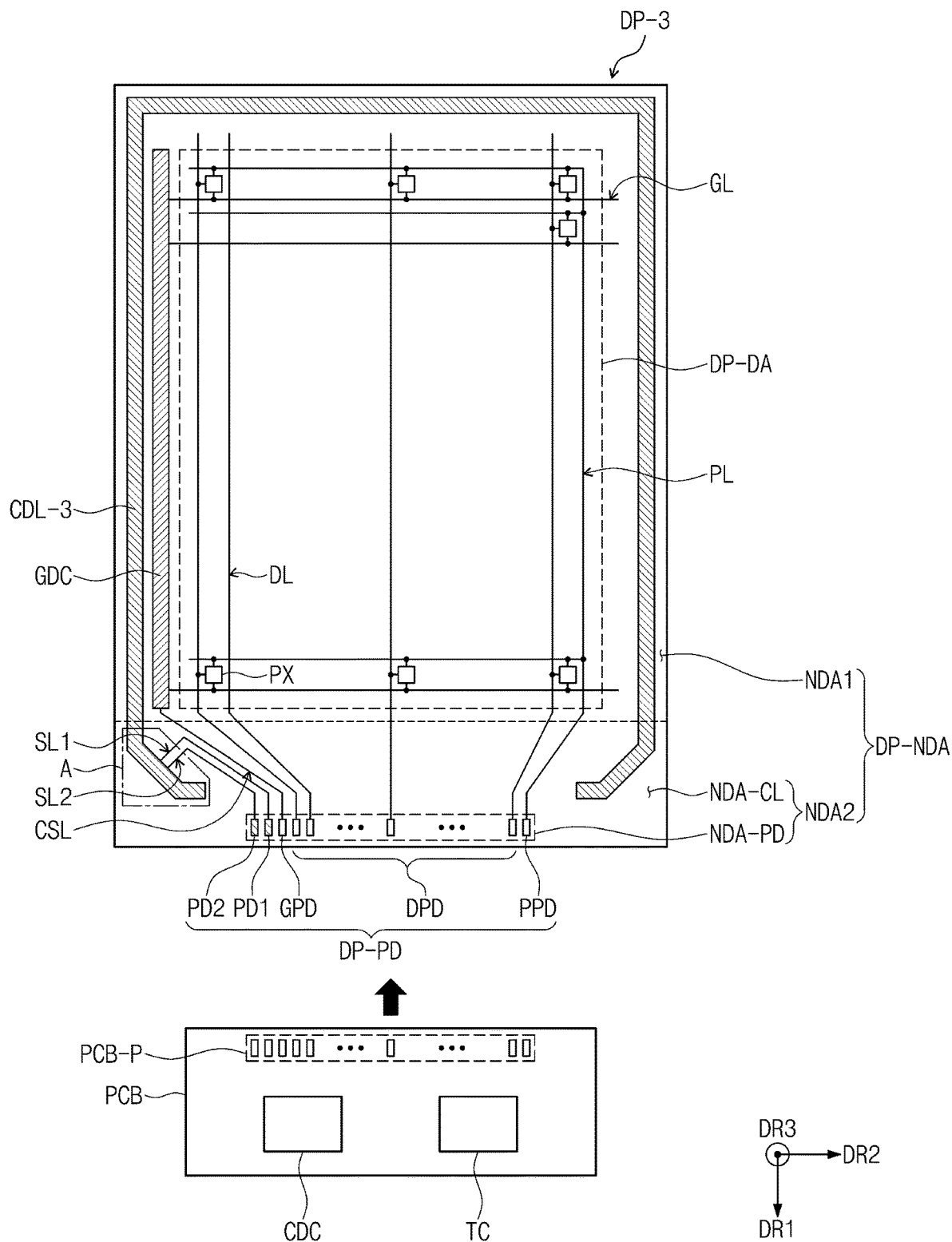
FIG. 14 is a plan view of a display panel according to other embodiments of the inventive concept.
Figure 15:
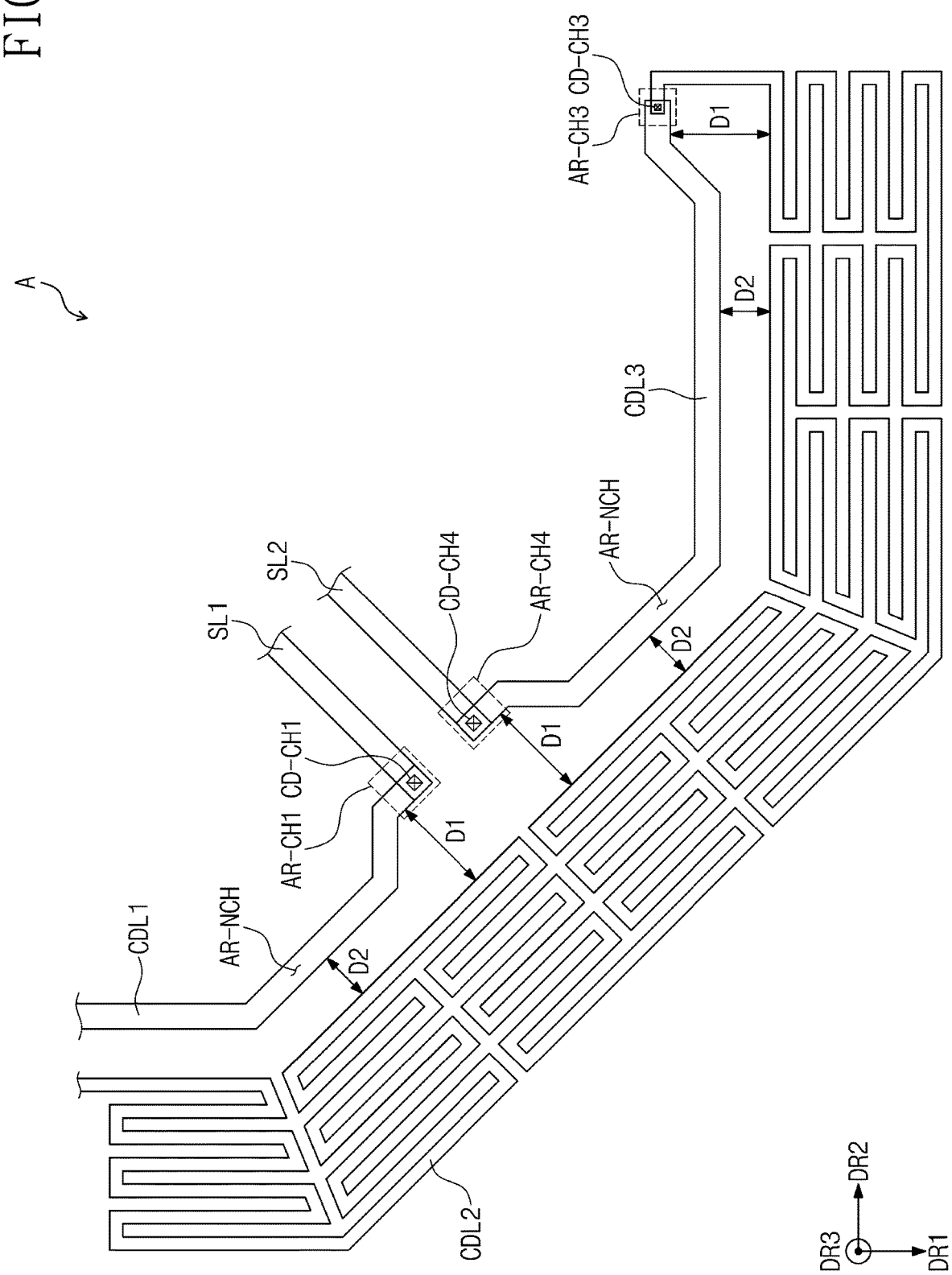
FIG. 15 is an enlarged view of a region 'A' of FIG. 14.

FIG. 14 is a plan view of a display panel DP-3 according to other embodiments of the inventive concept, and FIG. 15 is an enlarged view of a region 'A' of FIG. 14.

Referring to FIGS. 14 and 15, a display panel DP-3 according to other embodiments of the inventive concept may include a detection line CDL-3 that is provided in the signal line region NDA-CL of the second non-display region NDA2 and the first non-display region NDA1. In the signal line region NDA-CL, the detection line CDL-3 may be connected to the input line SL1 and the output line SL2.

In the present embodiments, an end of the first line portion CDL1 may be connected to the input line SL1, at a side region of the signal line region NDA-CL in the second direction DR2.

An opposite end of the first line portion CDL1 may be connected to an end of the second line portion CDL2, at an opposite side region of the signal line region NDA-CL in the second direction DR2.

In the present embodiments, the detection line CDL-3 may further include a third line portion CDL3. The third line portion CDL3 may be connected to the second line portion CDL2 and the output line SL2.

In detail, an opposite end of the second line portion CDL2 may be connected to an end of the third line portion CDL3, at a side region of the signal line region NDA-CL in the second direction DR2.

The third line portion CDL3 may be provided at a different level from that of the second line portion CDL2. The third line portion CDL3 may be connected to the second line portion CDL2 through a third interconnection contact hole CD-CH3. When viewed in a plan view, a region, in which the third interconnection contact hole CD-CH3 is formed, may be referred to as a third contact region AR-CH3.

In the present embodiments, the third line portion CDL3 may be provided at the same level as that of the first line portion CDL1. For example, the third line portion CDL3 may be provided at the same level as that of the input electrodes DE1 and DE2 and the output electrodes SE1 and SE2 of the first and second transistors T1 and T2.

The third line portion CDL3 may be connected to the output line SL2. In detail, an end of the third line portion CDL3 may be connected to the output line SL2, at a side region of the signal line region NDA-CL in the second direction DR2.

The third line portion CDL3 and the output line SL2 may be provided at different levels. The third line portion CDL3 may be connected to the output line SL2 through a fourth interconnection contact hole CD-CH4. When viewed in a plan view, a region, in which the fourth interconnection contact hole CD-CH4 is formed, will be referred to as a fourth contact region AR-CH4.

In the present embodiments, a distance between the third line portion CDL3 positioned in the third or fourth contact region AR-CH3 or AR-CH4 and the second line portion CDL2 positioned in the non-contact region AR-NCH may be equal to the first distance D1. Also, a distance between the third and second line portions CDL3 and CDL2 positioned in the non-contact region AR-NCH may be equal to the second distance D2.

In the present embodiments, the detection line CDL-3 extends to the signal line region NDA-CL of the second non-display region NDA2 beyond the first non-display region NDA1. That is, since the area where the detection line CDL-3 is disposed on the display panel DP is increased, it may be possible to more precisely determine whether a crack is formed in the display panel DP.

Figure 16:
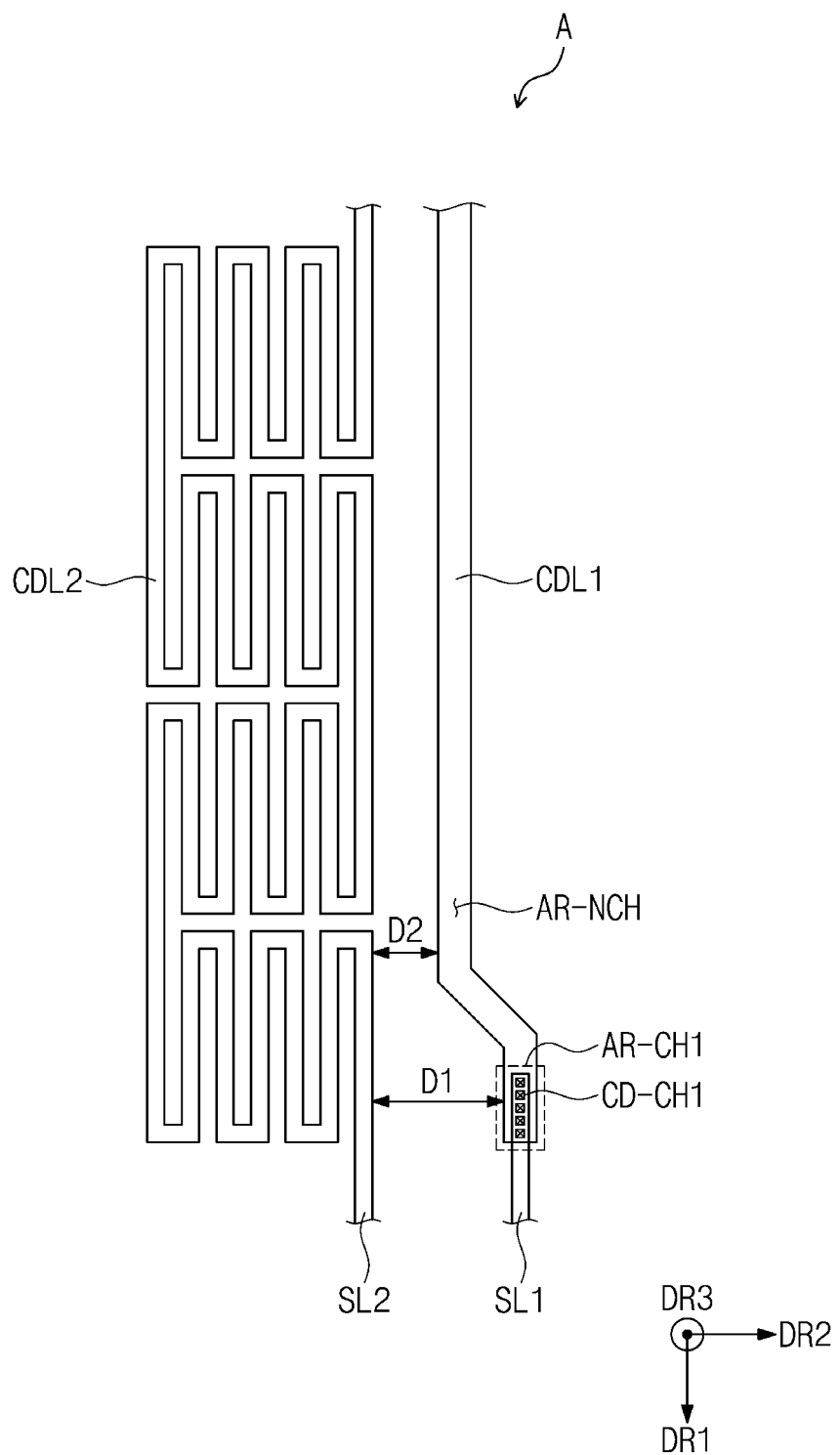
FIG. 16 is an enlarged view of a region 'A' according to other embodiments of the inventive concept.

FIG. 16 is an enlarged view of a region 'A' according to other embodiments of the inventive concept.

For concise description, a previously described element may be identified by a similar or identical reference number without repeating an overlapping description thereof. Other elements that are not separately described may be configured to have substantially the same technical features as those in the previously described embodiments.

For convenience in illustration, only one (e.g., the first contact region AR-CH1) of the plurality of contact regions is illustrated in FIG. 16. For the sake of simplicity, the description that follows will refer to only the first contact region AR-CH1, but other contact regions may be configured to have substantially the same features as those of the first contact region AR-CH1 to be described herein.

According to other embodiments of the inventive concept, as shown in FIG. 16, a plurality of first interconnection contact holes CD-CH1 may be formed in the first contact region AR-CH1. The plurality of first interconnection contact holes CD-CH1 may be used to connect the input line SL1 and the first line portion CDL1 to each other.

In this case, even when some of the plurality of contact holes CD-CH1 are damaged, the input line SL1 and the first line portion CDL1 may be electrically connected to each other by the remaining undamaged ones of the contact holes CD-CH1. That is, as described above, the plurality of interconnection contact holes CD-CH1 are used to connect the input line SL1 to the first line portion CDL1, it may be possible to improve durability or reliability of the detection line CDL.

Figure 17:
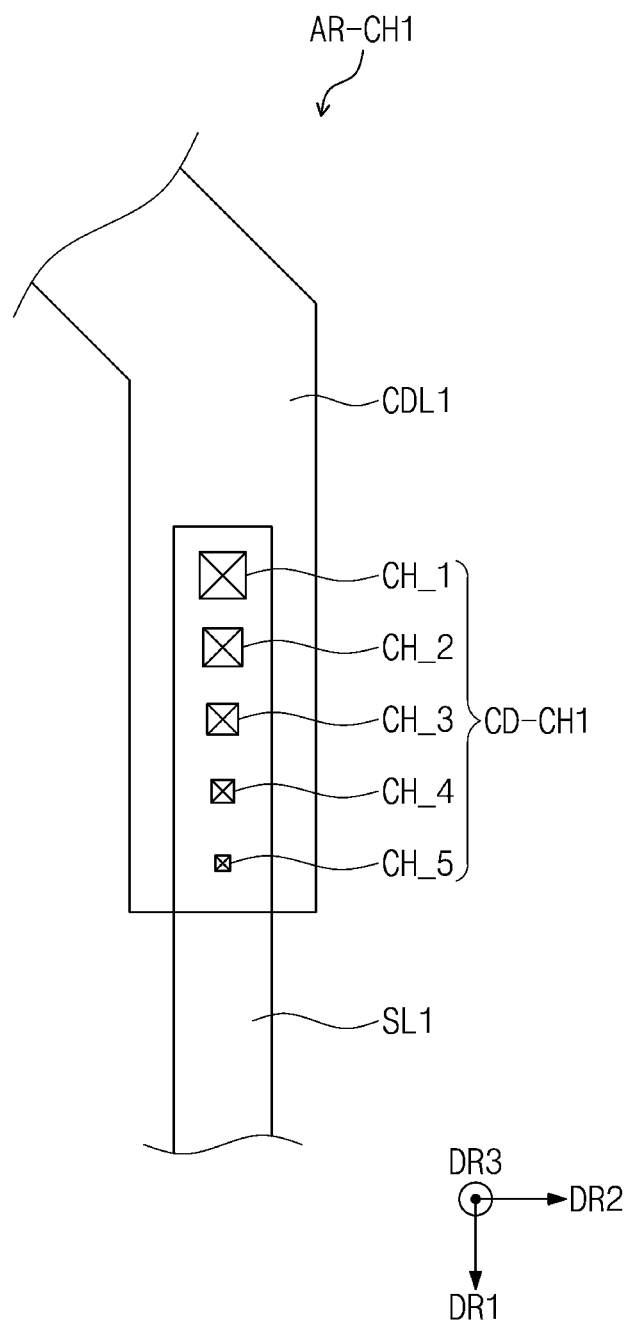
FIG. 17 is an enlarged view of a first contact region according to other embodiments of the inventive concept.

FIG. 17 is an enlarged view of a first contact region AR-CH1 according to other embodiments of the inventive concept.

For concise description, a previously described element may be identified by a similar or identical reference number without repeating an overlapping description thereof. Other elements that are not separately described may be configured to have substantially the same technical features as those in the previously described embodiments.

For convenience in illustration, only one (e.g., the first contact region AR-CH1) of the plurality of contact regions is illustrated in FIG. 17. For the sake of simplicity, the description that follows will refer to only the first contact region AR-CH1, but other contact regions may be configured to have substantially the same features as those of the first contact region AR-CH1 to be described herein.

According to other embodiments of the inventive concept, as shown in FIG. 17, a plurality of first interconnection contact holes CD-CH1 may be formed in the first contact region AR-CH1. The first interconnection contact holes CD-CH1 may be used to connect the input line SL1 and the first line portion CDL1 to each other.

In the present embodiments, the first interconnection contact holes CD-CH1 may include interconnection contact holes CH_1, CH_2, CH_3, CH_4, and CH_5 having different sizes from each other. Although FIG. 17 illustrates an example in which all of the first interconnection contact holes CH_1-CH_5 are formed to have different sizes from each other, at least some of the first interconnection contact holes CH_1-CH_5 may be provided to have different sizes from each other.

Figure 18:
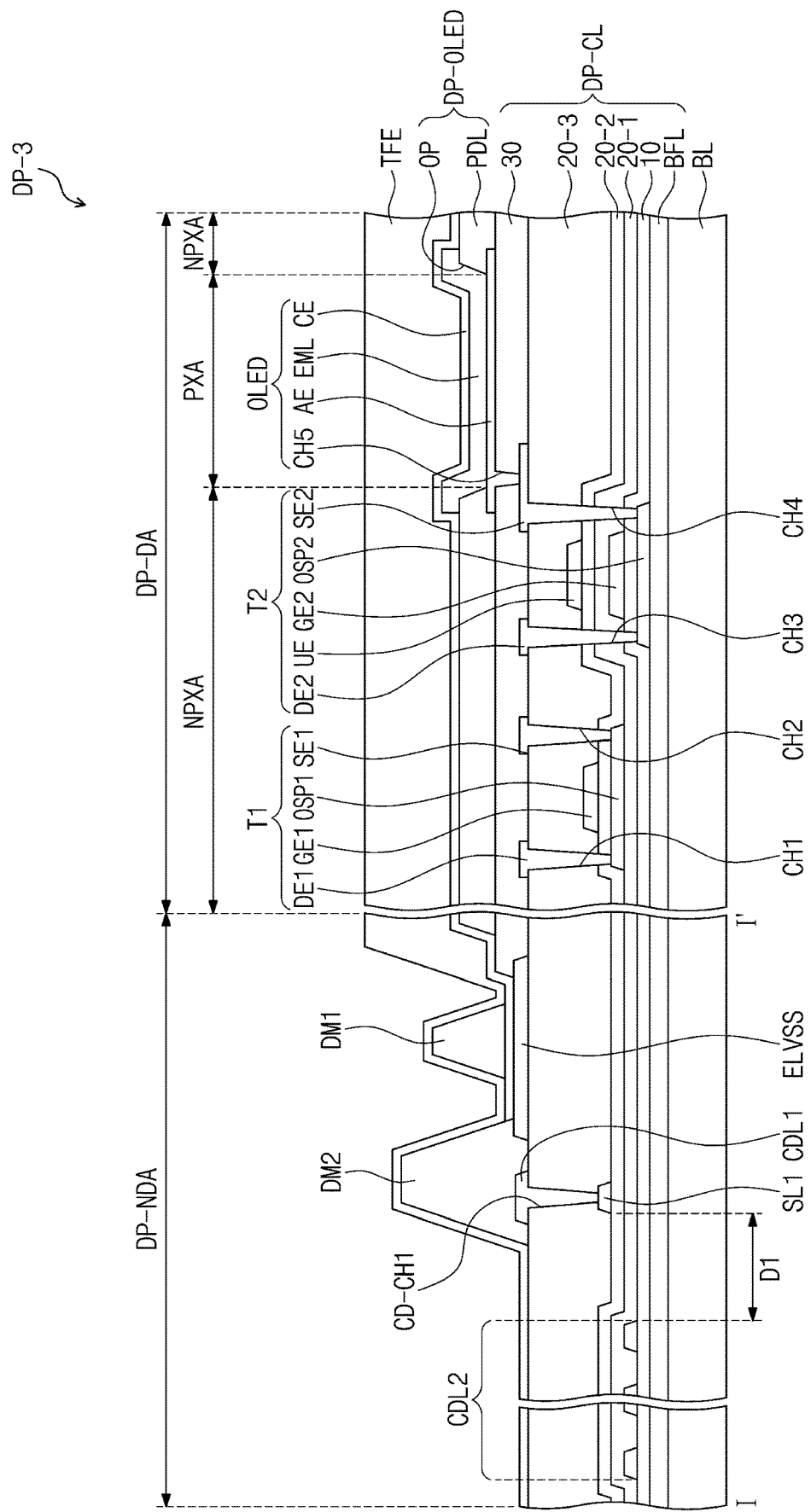
FIG. 18 is an enlarged sectional view of a display panel according to other embodiments of the inventive concept.

FIG. 18 is an enlarged sectional view of a display panel DP-3 according to other embodiments of the inventive concept.

For concise description, a previously described element may be identified by a similar or identical reference number without repeating an overlapping description thereof. Other elements that are not separately described may be configured to have substantially the same technical features as those in the previously described embodiments.

Referring to FIG. 18, the circuit device layer DP-CL may include the buffer layer BFL, the first intermediate inorganic layer 10, the intermediate organic layer 30, and second intermediate inorganic layers 20-1, 20-2, and 20-3. The second intermediate inorganic layers 20-1, 20-2, and 20-3 may include a first intermediate layer 20-1, a second intermediate layer 20-2, and a third intermediate layer 20-3.

The second semiconductor pattern OSP2 of the second transistor T2 may be provided on the buffer layer BFL. The first intermediate inorganic layer 10 may be provided on the second semiconductor pattern OSP2. The second control electrode GE2 and the second line portion CDL2 may be provided on the first intermediate inorganic layer 10. The second control electrode GE2 may be overlapped with the display region DP-DA, and the second line portion CDL2 may be overlapped with the non-display region DP-NDA.

The first intermediate layer 20-1 may be provided on the first intermediate inorganic layer 10 to cover the second control electrode GE2 and the second line portion CDL2. The first semiconductor pattern OSP1 of the first transistor T1 may be provided on the first intermediate layer 20-1. The second intermediate layer 20-2 may be provided on the first intermediate layer 20-1 to cover the first semiconductor pattern OSP1.

In the present embodiments, the circuit device layer DP-CL may further include an upper electrode UE. The first control electrode GE1 and the upper electrode UE may be provided on the second intermediate layer 20-2. The first control electrode GE1 may be overlapped with the first semiconductor pattern OSP1. The upper electrode UE may be overlapped with the second control electrode GE2, when viewed in a plan view. Since the upper electrode UE is provided on the second control electrode GE2, the upper electrode UE and the second control electrode GE2 may constitute a capacitor. In other words, an electric field may be produced between overlapped portions of the upper electrode UE and the second control electrode GE2. The capacitor may correspond to the capacitor Cst of FIG. 5.

In the present embodiments, the second control electrode GE2 may be used not only as a part of the second transistor T2 but also as one electrode of the capacitor Cst.

The third intermediate layer 20-3 may be provided on the second intermediate layer 20-2 to cover the first control electrode GE1 and the upper electrode UE. The first input and output electrodes DE1 and SE1 of the first transistor T1, the second input and output electrodes DE2 and SE2 of the second transistor T2, and the first line portion CDL1 of the detection line CDL may be provided on the third intermediate layer 20-3. The input electrodes DE1 and DE2 and the output electrodes SE1 and SE2 of the first and second transistors T1 and T2 may be overlapped with the display region DP-DA, and the first line portion CDL1 may be overlapped with the non-display region DP-NDA.

The first input electrode DE1 and the first output electrode SE1 may be connected to two different portions of the first semiconductor pattern OSP1 through the first contact hole CH1 and the second contact hole CH2, respectively, which are formed to penetrate both of the second and third intermediate layers 20-2 and 20-3. The second input electrode DE2 and the second output electrode SE2 may be connected to two different portions of the second semiconductor pattern OSP2 through the third contact hole CH3 and the fourth contact hole CH4, respectively, which are formed to penetrate the first intermediate inorganic layer 10 and the first to third intermediate layers 20-1, 20-2, and 20-3.

The intermediate organic layer 30 may be provided on the second intermediate inorganic layers 20-1, 20-2, and 20-3 to cover the first input electrode DE1, the second input electrode DE2, the first output electrode SE1, and the second output electrode SE2. The intermediate organic layer 30 may be provided to have a flat surface.

Figure 19:
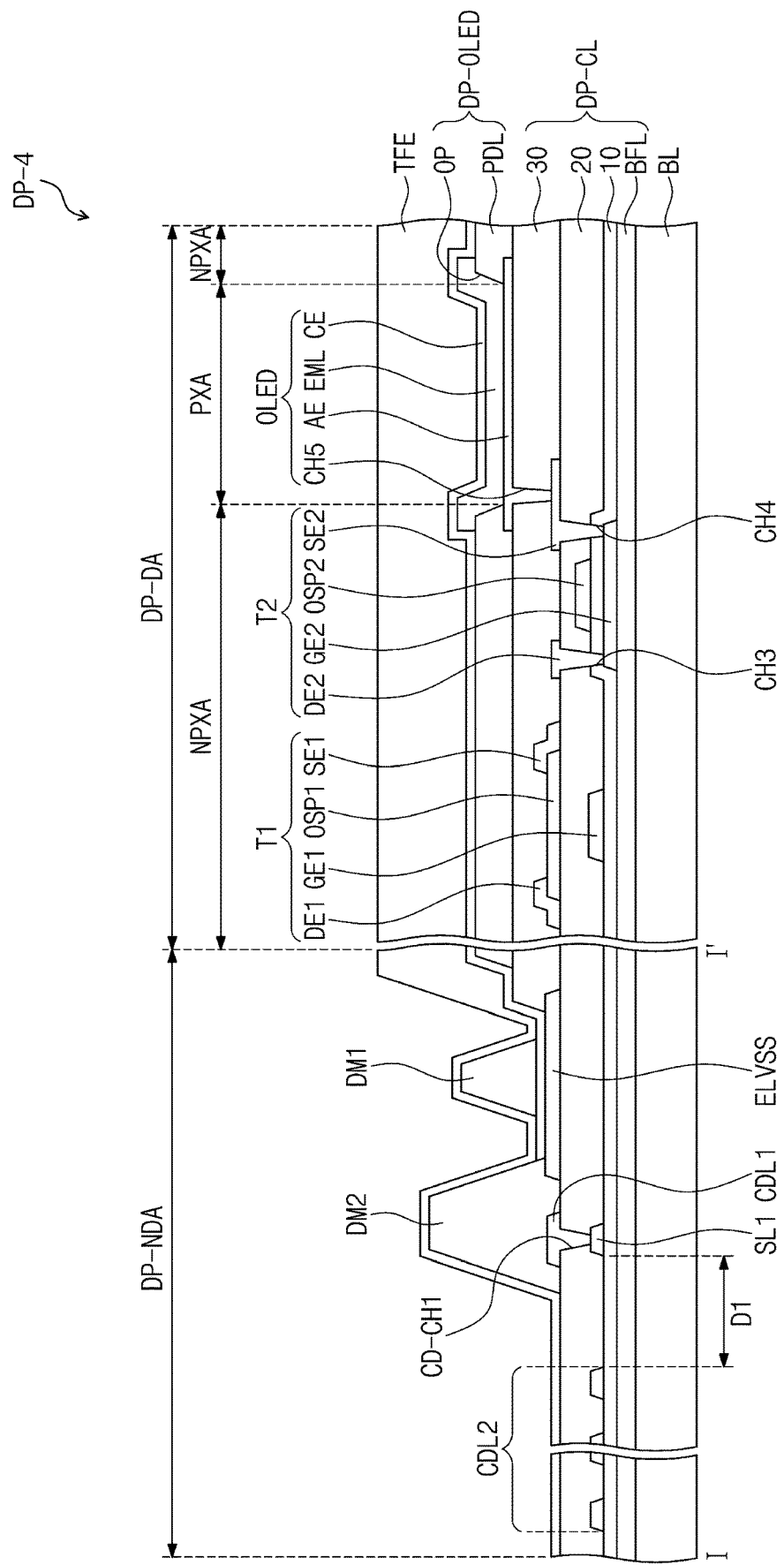
FIG. 19 is an enlarged sectional view of a display panel according to other embodiments of the inventive concept.

FIG. 19 is an enlarged sectional view of a display panel DP-4 according to other embodiments of the inventive concept.

For concise description, a previously described element may be identified by a similar or identical reference number without repeating an overlapping description thereof. Other elements that are not separately described may be configured to have substantially the same technical features as those in the previously described embodiments.

Referring to FIG. 19, the first transistor T1 according to other embodiments of the inventive concept may have a bottom gate structure. In other words, the first semiconductor pattern OSP1 of the first transistor T1 may be provided on the first control electrode GE1.

In detail, the first transistor T1 may include the first control electrode GE1 provided on the first intermediate inorganic layer 10, the first semiconductor pattern OSP1 provided on the second intermediate inorganic layer 20, and the first input electrode DE1 and the first output electrode SE1 provided on the intermediate organic layer 30. The first control electrode GE1 may be provided between the first intermediate inorganic layer 10 and the second intermediate inorganic layer 20.

The first semiconductor pattern OSP1 may be provided on the first control electrode GE1. The first semiconductor pattern OSP1 may be overlapped with the first control electrode GE1, when viewed in a plan view. The first input and output electrodes DE1 and SE1 may be provided on the second intermediate inorganic layer 20 to partially cover two portions of the first semiconductor pattern OSP1. Although not shown, the first transistor T1 may further include an ohmic contact layer which is formed between the first semiconductor pattern OSP1 and the first input and output electrodes DE1 and SE1.

The second transistor T2 may correspond to the second transistor T2 shown in FIG. 6. For concise description, description of overlapping elements previously described may be omitted.

in the present embodiments, the first line portion CDL1 may be provided at the same level as that of the first semiconductor pattern OSP1, the first input electrode DE1 and the first output electrode SE1.

According to some embodiments of the inventive concept, it may be possible to improve durability of a display device.

While example embodiments of the inventive concepts have been particularly shown and described, it will be understood by one of ordinary skill in the art that variations in form and detail may be made therein without departing from the spirit and scope of the attached claims.

What is claimed is:

1. A display device, comprising a display panel including a display region and a non-display region enclosing the display region, when viewed in a plan view,
    wherein the display panel comprises:
    a detection line overlapped with the non-display region;
    detection pads connected to the detection line; and
    a signal line connecting the detection pads to the detection line,
    wherein the detection line comprises:
    a first line portion provided at a level different from a level of the signal line, the first line portion including an end portion, which is connected to the signal line through a first interconnection contact hole in a first contact region; and
    a second line portion provided at a level different from the level of the first line portion,
    wherein, when viewed in the plan view, the first line portion is provided closer to the display region than the second line portion, and
    a distance between the first line portion and the second line portion in a non-contact region is less than a distance between the first interconnection contact hole and the second line portion.

2. The display device of claim 1, wherein the second line connected to the first line portion through a second interconnection contact hole in a second contact region, and
    the distance between the first line portion and the second line portion in the non-contact region is less than a distance between the second interconnection contact hole and the second line portion.

3. The display device of claim 1, wherein the detection pads comprise an input pad and an output pad,
    the signal line comprises an input line connecting the input pad and an output line connecting the output pad, and
    the second line portion includes an end portion, which is connected to the first line portion, and an opposite end portion, which is connected to the output line.

4. The display device of claim 3, wherein the second line portion and the output line are provided in the form of a single body.

5. The display device of claim 3, wherein, when viewed in a plan view, at least a portion of the detection line has a bent shape a plurality of times in the form of a branch.

6. The display device of claim 3, wherein the input line and the output line are provided at a same level as the level of the second line portion.

7. The display device of claim 3, wherein at least one of the first and second interconnection contact holes is provided in plural.

8. The display device of claim 7, wherein the first interconnection contact hole includes a plurality of first interconnection contact holes, some of which have different sizes from each other.

9. The display device of claim 7, wherein the second interconnection contact hole includes a plurality of second interconnection contact holes, some of which have different sizes from each other.

10. The display device of claim 3, wherein the non-display region comprises:
    a first non-display region enclosing the display region, the detection line being provided in the first non-display region; and
    a second non-display region connected to the first non-display region, the second non-display region including a pad region, on which the detection pads are provided, and a signal line region, on which the input line and output line are provided.

11. The display device of claim 10, wherein the detection line is provided in the first non-display region and the signal line region of the second non-display region, and
    the input line and the output line are connected to the detection line, in the signal line region.

12. The display device of claim 3, wherein the non-display region comprises a bending region, and
    the display panel is bent about a bending axis in the bending region.

13. The display device of claim 3, wherein each of the detection line, the input line, and the output line is provided in plural,
    wherein each of the detection lines comprises:
    a first detection line provided adjacent to a side region of the display region; and
    a second detection line provided adjacent to an opposite side region of the display region,
    wherein the first and second detection lines are connected to corresponding ones of the input and output lines.

14. The display device of claim 3, wherein the distance between the first interconnection contact hole and the second line portion and a distance between the second interconnection contact hole and the second line portion is larger than or equal to 50 μm.

15. A display device, comprising a display panel including a display region and a non-display region enclosing the display region, when viewed in a plan view,
wherein the display panel comprises:
a detection line overlapped with the non-display region;
detection pads connected to the detection line; and
a signal line connecting the detection pads to the detection line,
wherein the detection line comprises:
a first line portion provided at a level different from a level of the signal line, the first line portion including an end portion, which is connected to the signal line through a first interconnection contact hole in a first contact region; and
a second line portion provided at a level different from the level of the first line portion,
wherein, when viewed in the plan view, the first line portion is provided closer to the display region than the second line portion, and
at least a part of the first line portion is inclined in a direction away from the second line portion in a plan view.

* * * * *